(12) United States Patent
Ooga et al.

(10) Patent No.: US 8,674,017 B2
(45) Date of Patent: Mar. 18, 2014

(54) (POLY)CARBONATE POLYOL AND CARBOXYL GROUP-CONTAINING POLYURETHANE OBTAINED FROM THE (POLY)CARBONATE POLYOL

(75) Inventors: Kazuhiko Ooga, Minato-ku (JP); Ritsuko Azuma, Minato-ku (JP); Atsushi Umino, Minato-ku (JP)

(73) Assignee: Showa Denko K.K., Tokyo (JP)

( * ) Notice: Subject to any disclaimer, the term of this patent is extended or adjusted under 35 U.S.C. 154(b) by 182 days.

(21) Appl. No.: 13/145,241

(22) PCT Filed: Jan. 20, 2010

(86) PCT No.: PCT/JP2010/050611
§ 371 (c)(1),
(2), (4) Date: Jul. 19, 2011

(87) PCT Pub. No.: WO2010/084872
PCT Pub. Date: Jul. 29, 2010

(65) Prior Publication Data
US 2011/0272183 A1    Nov. 10, 2011

(30) Foreign Application Priority Data
Jan. 20, 2009  (JP) .................................. 2009-010238

(51) Int. Cl.
*C08L 75/00* (2006.01)
*C08G 18/08* (2006.01)
*H05K 1/00* (2006.01)
*B05D 5/12* (2006.01)

(52) U.S. Cl.
USPC ........... 524/590; 524/591; 174/254; 427/96.2

(58) Field of Classification Search
USPC ................... 524/590, 591; 174/254; 427/96.2
See application file for complete search history.

(56) References Cited

U.S. PATENT DOCUMENTS

| | | | |
|---|---|---|---|
| 5,621,065 A | 4/1997 | Pudleiner et al. |
| 6,162,889 A | 12/2000 | Orikabe et al. |
| 6,380,343 B1 | 4/2002 | Orikabe et al. |
| 6,716,892 B1 | 4/2004 | Mori et al. |

(Continued)

FOREIGN PATENT DOCUMENTS

| | | | |
|---|---|---|---|
| JP | 8-283399 A | 10/1996 |
| JP | 10-231360 A | 9/1998 |

(Continued)

OTHER PUBLICATIONS

Machine translation of JP11-236443A, 1999.*

(Continued)

*Primary Examiner* — Aiqun Li
(74) *Attorney, Agent, or Firm* — Sughrue Mion, PLLC

(57) ABSTRACT

An object of the invention is to provide carboxyl group-containing polyurethanes that have small curing warpage and can give cured products having excellent electrical insulating properties and flexibility, curable compositions that contain the carboxyl group-containing polyurethane and can give cured products having good electrical insulating properties, cured products obtained from the compositions, flexible circuit boards covered with the cured products, and processes for manufacturing flexible circuit boards. The carboxyl group-containing polyurethane is obtainable from materials including a (poly)carbonate polyol (a), a polyisocyanate (b) and a carboxyl group-containing polyol (c). The (poly) carbonate polyol includes an organic residue derived from a dimer diol and an organic residue derived from a polyol having a C10-20 alicyclic structure.

12 Claims, 16 Drawing Sheets

(56) References Cited

U.S. PATENT DOCUMENTS

| | | |
|---|---|---|
| 7,642,334 B2 | 1/2010 | Uchida et al. |
| 7,741,411 B2 | 6/2010 | Uchida et al. |
| 2009/0082518 A1 | 3/2009 | Uchida et al. |
| 2009/0171015 A1 | 7/2009 | Uchida et al. |

FOREIGN PATENT DOCUMENTS

| | | | |
|---|---|---|---|
| JP | 10-251369 A | | 9/1998 |
| JP | 10-251398 A | | 9/1998 |
| JP | 10-273514 A | | 10/1998 |
| JP | 11-061038 A | | 3/1999 |
| JP | 11-508636 A | | 7/1999 |
| JP | 11-236443 A | | 8/1999 |
| JP | 2000-007909 A | | 1/2000 |
| JP | 2004-137370 A | | 5/2004 |
| JP | 2004-182792 A | | 7/2004 |
| JP | 2006-312729 A | | 11/2006 |
| JP | 2006-348278 A | | 12/2006 |
| JP | 2007-100037 A | | 4/2007 |
| WO | WO 2006109816 A1 | * | 10/2006 |
| WO | WO 2007004738 A1 | * | 1/2007 |
| WO | 2007/066816 A1 | | 6/2007 |
| WO | 2008/029760 A1 | | 3/2008 |

OTHER PUBLICATIONS

Machine translation of JP10-251398A, 1998.*
Extended European Search Report for Application No. 10733479.9-1806 / 2390277 PCT/JP2010050611 dated Feb. 28, 2013.

* cited by examiner

(POLY)CARBONATE POLYOL AND CARBOXYL GROUP-CONTAINING POLYURETHANE OBTAINED FROM THE (POLY)CARBONATE POLYOL

TECHNICAL FIELD

The present invention relates to a (poly) carbonate polyol, a carboxyl group-containing polyurethane obtained from the (poly) carbonate polyol, a carboxyl group-containing polyurethane solution, a process for producing carboxyl group-containing polyurethanes, a curable composition containing a carboxyl group-containing polyurethane, a cured product from the composition, a flexible circuit board covered with the cured product, and a process for manufacturing flexible circuit boards.

BACKGROUND ART

Conventional surface protective films for flexible wiring circuits are adhesive-bonded polyimide films, called coverlay films, that are punched out with a die conforming to the pattern, or are screen-printed films of UV or heat curable overcoating agents having flexibility. In particular, the latter type is more advantageous in workability. Known such curable overcoating agents include resin compositions based on epoxy resins, acrylic resins or composites thereof. These compositions are frequently based on resins modified by the introduction of butadiene structures, siloxane structures, polycarbonate diol structures or long-chain aliphatic structures. Such modification provides improved flexibility and suppresses warpage due to cure shrinkage while minimizing the reduction in heat resistance, chemical resistance and electrical insulating properties inherent to the surface protective films.

However, with recent weight reduction and miniaturization of electronic equipment, flexible boards are reduced in weight and thickness and are consequently more significantly susceptible to the flexibility and cure shrinkage of the overcoating resin compositions. As a result, the curable overcoating agents do not satisfy performance requirements in terms of flexibility and warpage due to cure shrinkage.

For example, JP-A-H11-61038 (Patent Literature 1) discloses a resin composition including a polybutadiene block isocyanate and a polyol. Cured products of the composition have good flexibility and shrinkage factor, but are insufficient in heat resistance.

JP-A-2004-137370 (Patent Literature 2) discloses a polyamideimide resin produced through reaction of a polycarbonate diol and a diisocyanate compound into a polyurethane having a diisocyanate at both ends, and reaction of the polyurethane with trimellitic acid. However, cured products of the resin have unsatisfactory long-term reliability of electrical properties.

JP-A-2004-182792 (Patent Literature 3) discloses a polyamideimide resin with an organosiloxane structure. However, cured products of the resin have bad adhesion to substrates. Further, the reference requires the use of special solvents such as N-methyl-2-pyrrolidone. Such solvents can dissolve emulsifying agents in the screen printing, often resulting in problems.

JP-A-2006-348278 (Patent Literature 4) discloses a carboxyl group-containing polyurethane that has a polyol unit selected from the group consisting of polybutadiene polyols, polyisoprene polyols and hydrogenated polybutadiene polyols. With regard to the circuit pattern formation in the COF (chip on film) packaging systems as an example, the subtractive methods are currently a common technique in the production of circuits in the COF packaging systems. The carboxyl group-containing polyurethanes disclosed in Patent Literature 4 show sufficient insulating properties when used as insulating films for the circuits fabricated by the subtractive methods.

However, the flexible circuit boards are expected to have smaller pitches between circuits (for example, 20 μm pitches or less) with the developments in the semi-additive process.

To cope with narrower pitches, the development of resins having better electrical insulating properties has been desired.

On the other hand, polycarbonate diols prepared from dimer diols as materials (namely, polycarbonate diols having structural units from dimer diols) are known in the art (for example, JP-A-H10-231360 (Patent Literature 5) and JP-A-H10-251398 (Patent Literature 6)).

Further, polycarbonate diols that are prepared from polyols having a C10-20 alicyclic structure as materials (namely, polycarbonate diols having structural units from polyols with a C10-20 alicyclic structure) have been disclosed in the art (for example, JP-A-2006-312729 (Patent Literature 7)).

However, Patent Literatures 5 to 7 do not describe polycarbonate diols that have structural units from dimer diols and structural units from polyols having a C10-20 alicyclic structure.

Meanwhile, carboxyl group-containing polyurethanes prepared from dimer diols as materials are known in the art (for example, JP-A-2000-7909 (Patent Literature 8) and JP-A-2007-100037 (Patent Literature 9)).

Further, polyurethanes that are prepared from polycarbonate diols having dimer diol-derived structural units have been disclosed in the art (for example, JP-A-H10-273514 (Patent Literature 10) and JP-A-H10-251369 (Patent Literature 11)).

However, Patent Literatures 8 to 11 do not describe carboxyl group-containing polyurethanes that are prepared from polycarbonate diols having structural units from dimer diols and structural units from polyols having a C10-20 alicyclic structure.

CITATION LIST

Patent Literatures

Patent Literature 1: JP-A-H11-61038
Patent Literature 2: JP-A-2004-137370
Patent Literature 3: JP-A-2004-182792
Patent Literature 4: JP-A-2006-348278
Patent Literature 5: JP-A-H10-231360
Patent Literature 6: JP-A-H10-251398
Patent Literature 7: JP-A-2006-312729
Patent Literature 8: JP-A-2000-7909
Patent Literature 9: JP-A-2007-100037
Patent Literature 10: JP-A-H10-273514
Patent Literature 11: JP-A-H10-251369

SUMMARY OF INVENTION

Technical Problem

The present invention has been made in view of the problems in the art as described above. It is therefore an object of the invention to provide compounds that have small curing warpage and can give cured products having excellent electrical insulating properties and flexibility, curable compositions that contain the compounds and can give cured products having good electrical insulating properties, cured products obtained from the compositions, flexible circuit boards covered with the cured products, and processes for manufacturing flexible circuit boards.

Solution to Problem

The present inventors studied diligently to achieve the above object. They have then found that a curable composition which contains a polyurethane prepared from a carbonate with a specific structure has small curing warpage and can give cured products having excellent flexibility and electrical insulating properties. The present invention has been completed based on the finding.

In detail, an aspect (I) of the present invention is directed to a (poly) carbonate polyol which comprises an organic residue derived from a dimer diol and an organic residue derived from a polyol having a C10-20 alicyclic structure.

An aspect (II) of the invention is directed to a carboxyl group-containing polyurethane obtainable from at least the following components (a), (b) and (c) as materials:

component (a): the (poly)carbonate polyol according to the aspect (I) of the invention;
component (b): a polyisocyanate; and
component (c): a carboxyl group-containing polyol.

An aspect (III) of the invention is directed to a carboxyl group-containing polyurethane solution comprising the carboxyl group-containing polyurethane according to the aspect (II) and a solvent having a boiling point of 120 to 300° C.

An aspect (IV) of the invention is directed to a process for producing carboxyl group-containing polyurethanes which comprises reacting at least the following components (a), (b) and (c) at a temperature in the range of 30° C. to 160° C. in a solvent including at least one selected from the group consisting of diethylene glycol dimethyl ether, diethylene glycol diethyl ether, diethylene glycol ethyl methyl ether, diethylene glycol dibutyl ether, diethylene glycol butyl methyl ether, diethylene glycol isopropyl methyl ether, triethylene glycol dimethyl ether, triethylene glycol butyl methyl ether, tetraethylene glycol dimethyl ether, dipropylene glycol dimethyl ether, tripropylene glycol dimethyl ether, anisole, ethylene glycol monomethyl ether acetate, ethylene glycol monoethyl ether acetate, propylene glycol monomethyl ether acetate, propylene glycol monoethyl ether acetate, dipropylene glycol monomethyl ether acetate, dipropylene glycol monoethyl ether acetate, diethylene glycol monoethyl ether acetate, diethylene glycol monomethyl ether acetate, methyl methoxypropionate, ethyl methoxypropionate, methyl ethoxypropionate, ethyl ethoxypropionate, decahydronaphthalene, cyclohexanone and γ-butyrolactone;

component (a): the (poly)carbonate polyol according to the aspect (I) of the invention;
component (b): a polyisocyanate; and component (c): a carboxyl group-containing polyol.

An aspect (V) of the invention is directed to a curable composition that comprises the carboxyl group-containing polyurethane according to the aspect (II) of the invention, a solvent having a boiling point of 120 to 300° C., and a curing agent.

An aspect (VI) of the invention is directed to a cured product obtainable by curing the curable resin composition according to the aspect (V) of the invention.

An aspect (VII) of the invention is directed to a flexible circuit board covered with a cured product in which a circuit is formed on a flexible substrate, wherein the surface of the flexible substrate having the circuit is partially or entirely covered with the cured product according to the aspect (VI) of the invention.

An aspect (VIII) of the invention is directed to a process for manufacturing flexible circuit boards covered with a protective film, which comprises printing the curable composition of the aspect (V) to an area including a tin-plated circuit pattern of a flexible circuit board to form a print film on the pattern, and heating and curing the print film at 80 to 130° C. to produce a protective film.

In more detail, the present invention is concerned with the following [1] to [14].

[1] A (poly) carbonate polyol which comprises an organic residue derived from a dimer diol and an organic residue derived from a polyol having a C10-20 alicyclic structure.

[2] The (poly) carbonate polyol described in [1], wherein the polyol having a C10-20 alicyclic structure is tricyclodecanedimethanol.

[3] A (poly) carbonate polyol represented by Formula (34):

[Chem. 1]

$$HO \mathord{-\!\!\!-} \left( R^6 \mathord{-\!\!\!-} O \mathord{-\!\!\!-} \underset{O}{\overset{O}{\underset{\|}{C}}} \mathord{-\!\!\!-} O \mathord{-\!\!\!-} R^6 \right)_t \mathord{-\!\!\!-} OH \qquad (34)$$

wherein each $R^6$ independently represents an alkylene group belonging to the group (A), the group (B) or the group (C) below; t is an integer of 1 or greater; of the groups $R^6$ as many as indicated by (t+1), at least one $R^6$ is an alkylene group belonging to the group (A); and of the groups $R^6$ as many as indicated by (t+1), at least one $R^6$ is an alkylene group belonging to the group (B);

Group (A): alkylene groups represented by Formula (35) or (36) below;

Group (B): alkylene groups represented by Formula (37) or (38) below; and

Group (C): C9-12 linear aliphatic alkylene groups;

[Chem. 2]

$$\underset{-(CH_2)_q}{\overset{R^1}{\underset{R^2-}{\bigcirc}}} (CH_2)_p- \qquad (35)$$

wherein $R^1$ and $R^2$ are each an alkyl group, and the total of the numbers of the carbon atoms in $R^1$ and $R^2$, and p and q is 30;

[Chem. 3]

$$-(CH_2)_s \underset{}{\overset{R^4 \quad R^3}{\bigvee}} (CH_2)_r- \qquad (36)$$

wherein $R^3$ and $R^4$ are each an alkyl group, and the total of the numbers of the carbon atoms in $R^3$ and $R^4$, and r and s is 34;

[Chem. 4]

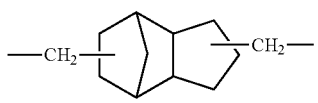
(37)

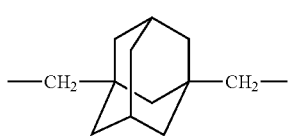
(38)

[4] A carboxyl group-containing polyurethane obtainable from at least the following components (a), (b) and (c) as materials:
component (a): the (poly) carbonate polyol described in any one of [1] to [3];
component (b): a polyisocyanate; and
component (c): a carboxyl group-containing polyol.

[5] A carboxyl group-containing polyurethane obtainable from at least the following components (a), (b), (c) and (d) as materials:
component (a): the (poly)carbonate polyol described in any one of [1] to [3];
component (b): a polyisocyanate;
component (c): a carboxyl group-containing polyol; and
component (d): a polyol other than the components (a) and (c).

[6] The carboxyl group-containing polyurethane described in [4] or [5], wherein the materials further include a monohydroxy compound (component (e)).

[7] The carboxyl group-containing polyurethane described in any one of [4] to [6], wherein the materials further include a monoisocyanate compound (component (f)).

[8] A carboxyl group-containing polyurethane solution which comprises the carboxyl group-containing polyurethane described in any one of [4] to [7] and a solvent having a boiling point of 120 to 300° C.

[9] A process for producing carboxyl group-containing polyurethanes which comprises reacting at least the following components (a), (b) and (c) at a temperature in the range of 30° C. to 160° C. in a solvent including at least one selected from the group consisting of diethylene glycol dimethyl ether, diethylene glycol diethyl ether, diethylene glycol ethyl methyl ether, diethylene glycol dibutyl ether, diethylene glycol butyl methyl ether, diethylene glycol isopropyl methyl ether, triethylene glycol dimethyl ether, triethylene glycol butyl methyl ether, tetraethylene glycol dimethyl ether, dipropylene glycol dimethyl ether, tripropylene glycol dimethyl ether, anisole, ethylene glycol monomethyl ether acetate, ethylene glycol monoethyl ether acetate, propylene glycol monomethyl ether acetate, propylene glycol monoethyl ether acetate, dipropylene glycol monomethyl ether acetate, dipropylene glycol monoethyl ether acetate, diethylene glycol monoethyl ether acetate, diethylene glycol monomethyl ether acetate, methyl methoxypropionate, ethyl methoxypropionate, methyl ethoxypropionate, ethyl ethoxypropionate, decahydronaphthalene, cyclohexanone and γ-butyrolactone;
component (a): the (poly)carbonate polyol described in any one of [1] to [3];
component (b): a polyisocyanate; and
component (c): a carboxyl group-containing polyol.

[10] A curable composition that comprises the carboxyl group-containing polyurethane described in any one of [4] to [7], a solvent having a boiling point of 120 to 300° C., and a curing agent.

[11] The curable composition described in [10], wherein the curing agent is a compound having two or more epoxy groups in the molecule.

[12] A cured product obtainable by curing the curable resin composition described in [10] or [11].

[13] A flexible circuit board covered with a cured product, in which a circuit is formed on a flexible substrate, wherein the surface of the flexible substrate having the circuit is partially or entirely covered with the cured product described in [12].

[14] A process for manufacturing flexible circuit boards covered with a protective film, which comprises printing the curable composition described in [10] or [11] to an area including a tin-plated circuit pattern of a flexible circuit board to form a print film on the pattern, and heating and curing the print film at 80 to 130° C. to produce a protective film.

Advantageous Effects of Invention

The cured products obtainable according to the present invention have no tackiness and show good handling properties, and also have high flexibility and moisture resistance. Further, they have high-level, long-term electrical insulating reliability, low warpage properties, good adhesion to substrates and underfill materials, and excellent solvent resistance. Because of these properties, the curable compositions of the present invention may be applied to flexible circuit boards or flexible substrates such as polyimide films and cured to give cured products (protective films) which allow for small warpage of the flexible circuit boards or the flexible substrates. Such boards or substrates having the protective films facilitate alignment in subsequent IC chip mounting steps.

Further, the cured products according to the present invention have flexibility and thus can form crack-resistant electrically insulating protective films on flexible circuit boards (for example, flexible printed circuit boards such as COF).

DESCRIPTION OF EMBODIMENTS

Figure 1:
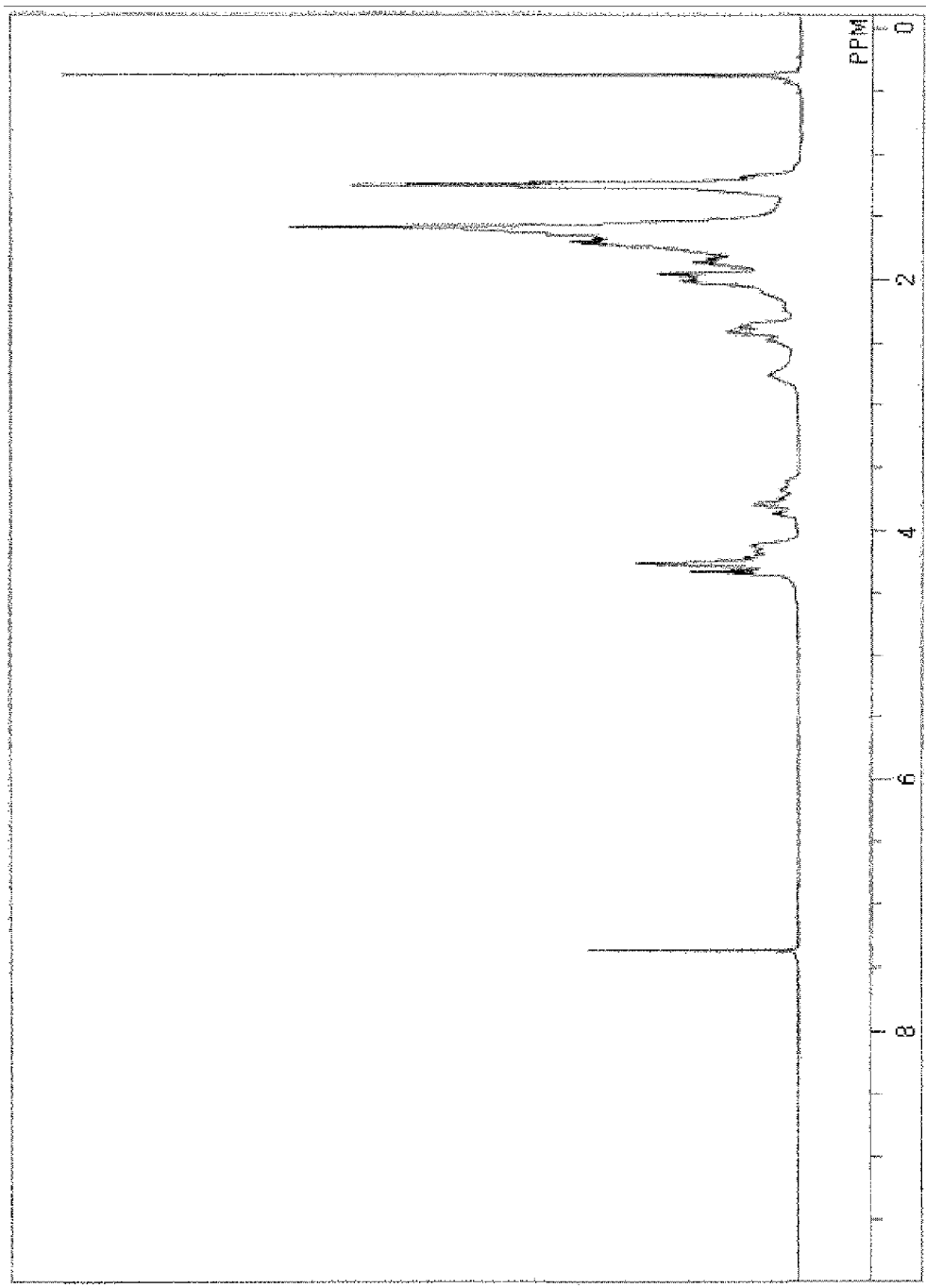
FIG. 1 is a $^1$H-NMR spectrum (solvent: $CDCl_3$) of a product A1 in Examples.

The present invention will be described in detail hereinbelow.

In the invention, the dimer diols refer to compounds that are based on C36 diols resulting from the reduction of dimer acids and/or lower alcohol esters thereof in the presence of catalysts, converting the carboxylic acid moiety of the dimer acids to alcohol. Herein, the dimer acids are known dibasic acids obtained by intermolecular polymerization of unsaturated fatty acids, for example by dimerization of C11-22 unsaturated fatty acids using catalysts such as clay catalysts. Dimer acids that are produced in the industry contain trimer acids or monomer acids in amounts varying depending on the purification degree, in addition to the dibasic acids of around 36 carbon atoms. As used herein, the words "based on" mean that the compounds account for 50% by mass or more. The compounds based on the C36 diols may contain diols having 22 to 44 carbon atoms except 36 carbon atoms. The dimer diols in the invention are particularly preferably hydrogenated dimer diols that result from the hydrogenation of carbon-carbon double bonds derived from the dimer acids. Commercial dimer diols are PRIPOL 2033 (manufactured by Croda Japan K.K.) and Sovermol 908 (manufactured by Cognis). PRIPOL 2033 is based on a mixture of compounds represented by Formulae (1) and (2) below. Commercial dimer acids are PRIPOL series 1006, 1009, 1015 and 1025 (manufactured by Croda Japan K.K.) and EMPOL 1062 (manufactured by Cognis).

Typical structures of the dimer diol compounds include those of Formulae (1) and (2):

[Chem. 5]

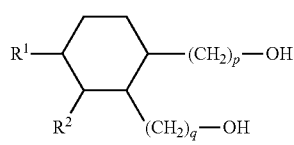

(1)

wherein $R^1$ and $R^2$ are each an alkyl group, and the total of the numbers of the carbon atoms in $R^1$ and $R^2$, and p and q is 30.

[Chem. 6]

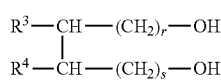

(2)

wherein $R^3$ and $R^4$ are each an alkyl group, and the total of the numbers of the carbon atoms in $R^3$ and $R^4$, and r and s is 34.

In the invention, the organic residues derived from dimer diols indicate structures derived by removing hydrogen from at least one alcoholic hydroxyl group of the dimer diols.

In the invention, the organic residues derived from polyols having a C10-20 alicyclic structure indicate structures derived by removing hydrogen from at least one alcoholic hydroxyl group of polyols having a C10-20 alicyclic structure.

The aspect (I) of the present invention will be described first.

The aspect (I) of the invention is directed to a (poly) carbonate polyol which comprises an organic residue derived from a dimer diol and an organic residue derived from a polyol having a C10-20 alicyclic structure.

The (poly)carbonate polyols in the aspect (I) of the invention are not particularly limited as long as the (poly) carbonate polyols include an organic residue derived from a dimer diol and an organic residue derived from a polyol having a C10-20 alicyclic structure.

The term "(poly)carbonate" in the (poly)carbonate polyols in the present specification means that the molecule has one or more carbonate bonds. Accordingly, the (poly) carbonate polyols in the present specification are compounds that have one or more carbonate bonds and two or more alcoholic hydroxyl groups in the molecule. Examples of the (poly) carbonate polyols include (poly)carbonate diols having two hydroxyl groups in the molecule, (poly)carbonate triols having three hydroxyl groups in the molecule, and (poly) carbonate tetraols having four hydroxyl groups in the molecule. The (poly)carbonate polyols may be generally produced by polymerizing material polyols via carbonate bonds.

The material polyols used are polyhydric alcohols including a dimer diol and a polyol having a C10-20 alicyclic structure. To produce carbonate bonds using these polyhydric alcohols, for example, the polyhydric alcohols may be ester exchanged with a carbonate ester such as dialkyl carbonate, diaryl carbonate or alkylene carbonate in the presence of a catalyst.

In the production of the (poly)carbonate polyols, the (poly) carbonate polyols obtained often contain the material polyols as residual components. In the present invention, such residual polyol components are not included in the definition of the (poly)carbonate polyols.

For example, a reference may be made to the production of a (poly)carbonate diol by ester exchange reaction using a dimer diol, tricyclo[5.2.1.0$^{2,6}$]decanedimethanol and diethyl carbonate as materials in the presence of a catalyst. When the (poly) carbonate diol produced contains the residual dimer diol and tricyclo[5.2.1.0$^{2,6}$]decanedimethanol each at 5% by mass, the residual dimer diol and tricyclo[5.2.1.0$^{2,6}$]decanedimethanol are not included in the (poly) carbonate polyol but are regarded as components (d) described later.

Examples of the polyols having a C10-20 alicyclic structure include tricyclodecanedimethanols such as tricyclo [5.2.1.0$^{2,6}$]decanedimethanol and tricyclo [3.3.1.1$^{3,7}$]decane-1,3-dimethanol, tricyclodecanediols such as tricyclo [5.2.1.0$^{2,6}$]decanediol and tricyclo [3.3.1.1$^{3,7}$]decane-1,3-diol, decahydronaphthalenediol, decahydronaphthalene-dimethanol, 2,2-bis(4-hydroxycyclohexyl)propane, bis(4-hydroxycyclohexyl)methane and bis(4-hydroxycyclohexyl).

Since the primary hydroxyl group is more reactive in the ester exchange reaction than the secondary hydroxyl group, at least one or more alcoholic hydroxyl groups of the alcoholic hydroxyl groups of the polyol having a C10-20 alicyclic structure are desirably primary hydroxyl groups.

Accordingly, preferred polyols having a C10-20 alicyclic structure are tricyclodecanedimethanols such as tricyclo [5.2.1.0$^{2,6}$]decanedimethanol and tricyclo[3.3.1.1$^{3,7}$]decane-1,3-dimethanol, and decahydronaphthalenedimethanol, and more preferred polyols are tricyclodecanedimethanols such as tricyclo[5.2.1.0$^{2,6}$]decanedimethanol and tricyclo [3.3.1.1$^{3,7}$]decane-1,3-dimethanol. In view of easy availability, tricyclo[5.2.1.0$^{2,6}$]decanedimethanol is most preferable.

As described above, the (poly)carbonate polyols according to the aspect (I) may be produced by the ester exchange reaction of polyhydric alcohols including the dimer diol and the polyol having a C10-20 alicyclic structure, with carbonate esters such as dialkyl carbonates, diaryl carbonates or alkylene carbonates in the presence of an ester exchange catalyst.

In more detail, polyhydric alcohols including the dimer diol and the polyol having a C10-20 alicyclic structure are subjected to ester exchange reaction with the carbonate ester in the presence of an ester exchange catalyst at atmospheric pressure and a temperature in the range of 110 to 280° C. while distilling away the by-product alcohols or phenols, and further the ester exchange reaction is performed at a reduced pressure and a temperature of 110 to 280° C. while distilling away the by-product alcohols or phenols.

The (poly)carbonate polyols according to the aspect (I) contain an organic residue derived from the dimer diol and an organic residue derived from the polyol having a C10-20 alicyclic structure. In addition, they may contain an organic residue derived from other polyol.

That is, the ester exchange reaction for producing the (poly) carbonate polyols of the aspect (I) may involve other polyol components as required in addition to the dimer diols and the polyols having a C10-20 alicyclic structure.

Examples of such additional polyol components include polyols having relatively high molecular weights, for example linear aliphatic polyols other than the dimer diols such as ethylene glycol, diethylene glycol, propylene glycol, 1,3-propanediol, 1,4-butanediol, 1,3-butanediol, 1,5-pentanediol, neopentyl glycol, 3-methyl-1,5-pentanediol, 1,6-hexanediol, 2-methyl-1,8-octanediol, 1,9-nonanediol, 2-ethyl-2-butyl-1,3-propanediol, 2,4-diethyl-1,5-pentanediol, 1,10-decanediol and 1,12-dodecanediol, polyols having a C9 or lower alicyclic structure such as 1,4-cyclohexanedimethanol, 1,3-cyclohexanedimethanol and 2-methylcyclohexane-1,1-dimethanol, polyols having an aromatic ring such as p-xylyleneglycol, bisphenol A ethylene oxide adduct, bisphenol F ethylene oxide adduct and biphenol ethylene oxide adduct, polyether polyols such as polyethylene glycol, polypropylene glycol and polytetramethylene glycol, polyester polyols such as polyhexamethylene adipate, polyhexamethylene succinate and polycaprolactone, and polycarbonate diols such as poly(1,6-hexamethylene carbonate), poly[(1,6-hexamethylene:3-methyl-1,5-pentylene)carbonate], poly[(1,6-hexamethylene:cyclohexane-1,4-dimethylene) carbonate] and poly[(1,9-nonylene:2-methyl-1,8-octylene)carbonate].

Of these polyols, C9-12 linear aliphatic polyols such as 2-methyl-1,8-octanediol, 1,9-nonanediol, 2-ethyl-2-butyl-1,3-propanediol, 2,4-diethyl-1,5-pentanediol, 1,10-decanediol and 1,12-dodecanediol are preferable in order that the electrical insulating properties of cured products according to the aspect (VI) described later may be maintained at high level and that the cured products according to the aspect (VI) will exhibit sufficient flexibility.

Specifically, the (poly)carbonate polyols according to the aspect (I) are preferably represented by Formula (34) below.

[Chem. 7]

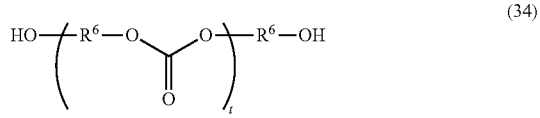

(34)

In Formula (34), each $R^6$ independently represents an alkylene group belonging to the group (A), the group (B) or the group (C) below; t is an integer of 1 or greater; of the groups $R^6$ as many as indicated by (t+1), at least one $R^6$ is an alkylene group belonging to the group (A); and of the groups $R^6$ as many as indicated by (t+1), at least one $R^6$ is an alkylene group belonging to the group (B).

Group (A): alkylene groups represented by Formula (35) or (36) below;
Group (B): alkylene groups represented by Formula (37) or (38) below; and
Group (C): C9-12 linear aliphatic alkylene groups.

[Chem. 8]

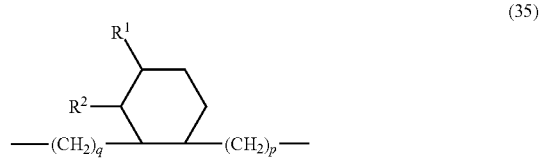

(35)

In Formula (35), $R^1$ and $R^2$ are each an alkyl group, and the total of the numbers of the carbon atoms in $R^1$ and $R^2$, and p and q is 30.

[Chem. 9]

(36)

In Formula (36), $R^3$ and $R^4$ are each an alkyl group, and the total of the numbers of the carbon atoms in $R^3$ and $R^4$, and r and s is 34.

[Chem. 10]

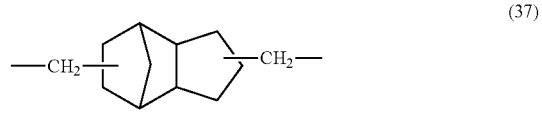

(37)

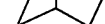

(38)

The (poly)carbonate polyols according to the aspect (I) may contain the organic residues derived from dimer diols and the organic residues derived from polyols having a C10-20 alicyclic structure, at any proportions without limitation as long as these residues are present in the (poly)carbonate polyols.

However, in an embodiment in the production of carboxyl group-containing polyurethanes according to the aspect (II), the dimer diol and the organic residue derived from the dimer diol preferably account for 10 to 70% by mass, more preferably 15 to 65% by mass, and most preferably 20 to 60% by mass of the total of the organic residues derived from the polyol components in the (poly) carbonate polyol, and the components (d).

Also, in an embodiment in the production of carboxyl group-containing polyurethanes according to the aspect (II), the polyol having a C10-20 alicyclic structure and the organic residue derived from the polyol having a C10-20 alicyclic structure preferably account for 10 to 50% by mass, more preferably 13 to 45% by mass, and most preferably 15 to 40% by mass of the total of the organic residues derived from the polyol components in the (poly)carbonate polyol, and the components (d).

The hydroxyl value of the (poly) carbonate polyols in the aspect (I) of the invention is not particularly limited. However, in an embodiment in the production of carboxyl group-containing polyurethanes according to the aspect (II) described later, the hydroxyl value of a mixture of the (poly) carbonate polyol in the aspect (I) and the components (d) described later is preferably 30 to 200, more preferably 40 to 180, and particularly preferably 45 to 160.

As used herein, the hydroxyl value of a mixture of the (poly) carbonate polyol in the aspect (I) and the components (d) indicates the hydroxyl value measured by a neutralization titration method in accordance with JIS K0070, with respect to a mixture of the (poly)carbonate polyol in the aspect (I) and the components (d) in a ratio that is adopted in the production of carboxyl group-containing polyurethanes according to the aspect (II) described later.

When no components (d) are present in the production of carboxyl group-containing polyurethanes according to the aspect (II), the hydroxyl value of a mixture of the (poly) carbonate polyol in the aspect (I) and the components (d) indicates the hydroxyl value of the (poly) carbonate polyol in the aspect (I) measured by a neutralization titration method in accordance with JIS K0070.

Next, the aspect (II) will be described.

The aspect (II) of the invention is directed to a carboxyl group-containing polyurethane obtainable from at least the following components (a), (b) and (c) as materials:

Component (a): the (poly)carbonate polyol according to the aspect (I) of the invention;
Component (b): a polyisocyanate; and
Component (c): a carboxyl group-containing polyol.

The component (a) that is a material in the aspect (II) is the above-described (poly) carbonate polyol according to the aspect (I). The (poly)carbonate polyols may be used singly, or two or more kinds may be used in combination.

The hydroxyl value of the component (a) in the aspect (II) is not particularly limited. However, the hydroxyl value of a mixture of the component (a) and the components (d) described later is preferably 30 to 200, more preferably 40 to 180, and particularly preferably 45 to 160.

As used herein, the hydroxyl value of a mixture of the component (a) and the components (d) indicates the hydroxyl value measured by a neutralization titration method in accordance with JIS K0070, with respect to a mixture of the component (a) and the components (d) in a ratio that is adopted in the production of carboxyl group-containing polyurethanes according to the aspect (II).

When no components (d) are present in the production of carboxyl group-containing polyurethanes according to the aspect (II), the hydroxyl value of a mixture of the component (a) and the components (d) indicates the hydroxyl value of the component (a) measured by a neutralization titration method in accordance with JIS K0070.

The polyisocyanates as the components (b) in the aspect (II) are not particularly limited as long as they are compounds having two or more isocyanate groups. Examples of the components (b) in the aspect (II) include 1,4-cyclohexane diisocyanate, isophorone diisocyanate, methylenebis(4-cyclohexyl isocyanate), 1,3-bis(isocyanatomethyl)cyclohexane, 1,4-bis(isocyanatomethyl)cyclohexane, 2,4-tolylene diisocyanate, 2,6-tolylene diisocyanate, diphenylmethane-4,4'-diisocyanate, 1,3-xylylene diisocyanate, 1,4-xylylene diisocyanate, isophorone diisocyanate biuret, hexamethylene diisocyanate biuret, isophorone diisocyanate isocyanurate, hexamethylene diisocyanate isocyanurate, lysine triisocyanate, lysine diisocyanate, hexamethylene diisocyanate, 2,4,4-trimethylhexamethylene diisocyanate, 2,2,4-trimethylhexanemethylene diisocyanate and norbornane diisocyanate. These polyisocyanates may be used singly, or two or more kinds may be used in combination.

In order to maintain high electrical insulating properties, the components (b) are preferably 1,4-cyclohexane diisocyanate, isophorone diisocyanate, methylenebis(4-cyclohexyl isocyanate), 1,3-bis(isocyanatomethyl)cyclohexane, 1,4-bis(isocyanatomethyl)cyclohexane, diphenylmethane-4,4'-diisocyanate, 1,3-xylylene diisocyanate, 1,4-xylylene diisocyanate, 2,4,4-trimethylhexamethylene diisocyanate, 2,2,4-trimethylhexanemethylene diisocyanate and norbornane diisocyanate, and are more preferably methylenebis(4-cyclohexyl isocyanate), diphenylmethane-4,4'-diisocyanate and norbornane diisocyanate.

The carboxyl group-containing polyols as the components (c) in the aspect (II) include dimethylolpropionic acid, 2,2-dimethylolbutanoic acid, N,N-bis(hydroxyethyl)glycine and N,N-bis (hydroxyethyl)glycine. Of these, dimethylolpropionic acid and 2,2-dimethylolbutanoic acid are particularly preferable in view of solubility in solvents. The carboxyl group-containing polyols may be used singly, or two or more kinds may be used in combination.

The carboxyl group-containing polyurethanes in the aspect (II) may be produced from the above-described three components (a), (b) and (c). To balance properties of the carboxyl group-containing polyurethanes, a polyol (component (d)) other than the components (a) and (c) may be preferably used. That is, the carboxyl group-containing polyurethanes in the aspect (II) are preferably prepared from at least the components (a), (b), (c) and (d) as materials.

Examples of the components (d) include linear aliphatic polyols such as dimer diol, trimer triol, ethylene glycol, diethylene glycol, propylene glycol, 1,3-propanediol, 1,4-butanediol, 1,3-butanediol, 1,5-pentanediol, neopentylglycol, 3-methyl-1,5-pentanediol, 1,6-hexanediol, 2-methyl-1,8-octanediol, 1,9-nonanediol, 2-ethyl-2-butyl-1,3-propanediol and 2,4-diethyl-1,5-pentanediol; polyols with an alicyclic structure such as 1,4-cyclohexanedimethanol, 1,3-cyclohexanedimethanol, tricyclo[5.2.1.0$^{2,6}$]decanedimethanol, tricyclo[3.3.1.1$^{3,7}$]decane-1,3-dimethanol, tricyclo[5.2.1.0$^{2,6}$]decanediol, tricyclo[3.3.1.1$^{3,7}$]decane-1,3-diol, decahydronaphthalenediol, decahydronaphthalenedimethanol, 2,2-bis(4-hydroxycyclohexyl)propane, bis(4-hydroxycyclohexyl)methane, bis(4-hydroxycyclohexyl) and 2-methylcyclohexane-1,1-dimethanol; polyols with an aromatic ring such as p-xylylene glycol, bisphenol A ethylene oxide adduct, bisphenol F ethylene oxide adduct and biphenol ethylene oxide adduct; polyether polyols such as polyethylene glycol, polypropylene glycol and polytetramethylene glycol; polyester polyols such as polyhexamethylene adipate, polyhexamethylene succinate and polycaprolactone; polycarbonate diols such as poly(1,6-hexamethylene carbonate), poly[(1,6-hexamethylene:3-methyl-1,5-pentylene)carbonate], poly[(1,6-hexamethylene:cyclohexane-1,4-dimethylene) carbonate] and poly[(1,9-nonylene:2-methyl-1,8-octylene)carbonate]; and hydroxyl-terminated imide compounds represented by Formula (3) below:

[Chem. 11]

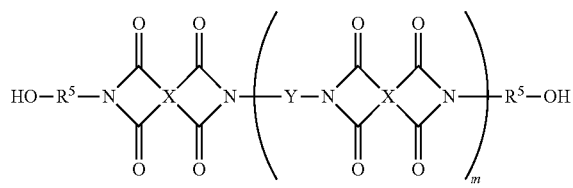

(3)

wherein the two groups $R^5$ each independently represent a divalent, aliphatic or aromatic hydrocarbon group, X as many as (m+1) each independently represent a residue of a tetracarboxylic acid after removal of the carboxyl groups, Y as many as indicated by the letter m each independently represent a residue of a diamine after removal of the amino groups, and m is an integer of 0 to 20.

Of the above polyols, preferred compounds are C9 or higher linear aliphatic polyols such as 2-methyl-1,8-octanediol, 1,9-nonanediol, 2-ethyl-2-butyl-1,3-propanediol and 2,4-diethyl-1,5-pentanediol, polyols with an alicyclic structure such as 1,4-cyclohexanedimethanol, 1,3-cyclohexanedimethanol, tricyclo[5,2,1,0$^{2,6}$]decanedimethanol and 2-methylcyclohexane-1,1-dimethanol, and dimer diols. The above polyols may be used singly, or two or more kinds may be used in combination.

As described hereinabove, in the production of the (poly) carbonatepolyols (components (a)), the (poly)carbonate polyols obtained often contain the material polyols as residual components (for example, the dimer diols and the polyols having a C10-20 alicyclic structure). In the present invention, such residual polyol components are the components (d) and are not included in the definition of the (poly) carbonate polyols.

The carboxyl group-containing polyurethanes in the aspect (II) may be produced from the above-described three or four components (a), (b), (c) and optionally (d). In the case where isocyanate groups are present at terminals of the carboxyl group-containing polyurethanes, the polyurethanes may be further reacted with a monohydroxy compound (component (e)) to eliminate influences of the terminal isocyanate groups. That is, the carboxyl group-containing polyurethanes in the aspect (II) may further involve the monohydroxy compound (component (e)) as a material.

Similarly, in the case where hydroxyl groups are present at terminals of the carboxyl group-containing polyurethanes in the aspect (II), the polyurethanes may be further reacted with a monoisocyanate compound (component (f)) to eliminate influences of the terminal hydroxyl groups. That is, the carboxyl group-containing polyurethanes in the aspect (II) may further involve the monoisocyanate compound (component (f)) as a material.

Examples of the components (e) include methanol, ethanol, n-propanol, isopropanol, n-butanol, isobutanol, sec-butanol, t-butanol, ethylene glycol monoethyl ether, diethylene glycol monoethyl ether, diethylene glycol monoisopropyl ether, diethylene glycol monoisobutyl ether and dipropylene glycol monopropyl ether. In view of the boiling point and the reactivity of the monohydroxy compounds, ethanol, n-propanol, isopropanol, n-butanol, isobutanol, ethylene glycol monoethyl ether, diethylene glycol monoethyl ether, diethylene glycol monoisopropyl ether, diethylene glycol monoisobutyl ether and dipropylene glycol monopropyl ether are preferred.

The monohydroxy compounds may be used singly, or two or more kinds may be used in combination.

Examples of the components (f) include cyclohexyl isocyanate, octadecyl isocyanate, phenyl isocyanate and toluoyl isocyanate. In view of heat resistance, cyclohexyl isocyanate and octadecyl isocyanate are preferred.

The monoisocyanate compounds may be used singly, or two or more kinds may be used in combination.

The carboxyl group-containing polyurethanes in the aspect (II) preferably have a number average molecular weight of 1,000 to 100,000, more preferably 3,000 to 50,000, and particularly preferably 5,000 to 30,000.

Herein, the number average molecular weight of the carboxyl group-containing polyurethanes is measured by gel permeation chromatography (hereinafter, GPC) relative to polystyrenes. If the molecular weight is less than 1,000, cured films described later may have poor elongation, flexibility and strength. If the molecular weight exceeds 100,000, the polyurethanes will show low solubility in solvents or give excessively viscous solutions, causing great restrictions in usage.

In the invention, the GPC conditions are as follows unless otherwise specified.

Chromatograph: HPLC unit HSS-2000 manufactured by JASCO Corporation

Columns: Three Shodex columns LF-804 connected (in series)

Mobile phase: tetrahydrofuran

Flow rate: 1.0 ml/min

Detector: RI-2031 Plus manufactured by JASCO Corporation

Temperature: 40.0° C.

Sample amount: Sample loop 100 μl

Sample concentration: approximately 0.1% by mass

The carboxyl group-containing polyurethanes in the aspect (II) preferably have an acid value of 5 to 120 mg KOH/g, and more preferably 10 to 50 mg KOH/g. If the acid value is less than 5 mg KOH/g, the polyurethanes may reduce the reactivity with other curable resins such as curing agents described later and the heat resistance may be deteriorated. If the acid value exceeds 120 mg KOH/g, cured films described later may be excessively rigid and brittle.

The carboxyl group-containing polyurethanes in the aspect (II) preferably have a number average molecular weight of 1,000 to 100,000 and an acid value of 5 to 120 mg KOH/g, and more preferably a number average molecular weight of 3,000 to 50,000 and an acid value of 10 to 50 mg KOH/g.

In the invention, the acid value of the carboxyl group-containing polyurethanes in the aspect (II) is measured by a potentiometric titration method in accordance with JIS K0070.

Next, carboxyl group-containing polyurethane solutions in the aspect (III) of the invention will be described.

The aspect (III) of the invention is directed to a carboxyl group-containing polyurethane solution that comprises the carboxyl group-containing polyurethane according to the aspect (II) and a solvent having a boiling point of 120 to 300° C.

The carboxyl group-containing polyurethanes according to the aspect (II) that are components for the carboxyl group-containing polyurethane solutions in the aspect (III) are as described hereinabove.

The solvents that are components for the carboxyl group-containing polyurethane solutions in the aspect (III) are not particularly limited as long as they have a boiling point of 120 to 300° C. and can dissolve the carboxyl group-containing polyurethanes according to the aspect (II). When the solvent used in the production of the carboxyl group-containing polyurethane of the aspect (II) is not replaced and is continuously used as the solvent for the carboxyl group-containing polyurethane solution in the aspect (III), the solvent should be low in reactivity with isocyanates.

The solvents that are components for the carboxyl group-containing polyurethane solutions in the aspect (III) preferably have a boiling point of 150 to 250° C., and more preferably 170 to 230° C.

In the invention, the boiling points of the solvents are boiling points at 1 atm unless otherwise mentioned.

For example, the solvent as a component constituting the carboxyl group-containing polyurethane solution in the aspect (III) may include at least one selected from ether solvents such as anisole, diethylene glycol dimethyl ether, diethylene glycol diethyl ether, diethylene glycol ethyl methyl ether, diethylene glycol dibutyl ether, diethylene glycol butyl methyl ether, diethylene glycol isopropyl methyl ether, triethylene glycol dimethyl ether, triethylene glycol butyl methyl ether, tetraethylene glycol dimethyl ether, dipropylene glycol dimethyl ether and tripropylene glycol dimethyl ether; ester solvents such as ethylene glycol monomethyl ether acetate, ethylene glycol monoethyl ether acetate, propylene glycol monomethyl ether acetate, propylene glycol monoethyl ether acetate, dipropylene glycol monomethyl ether acetate, dipropylene glycol monoethyl ether acetate, diethylene glycol monoethyl ether acetate, diethylene glycol monomethyl ether acetate, methyl methoxypropionate, ethyl methoxypropionate, methyl ethoxypropionate, ethyl ethoxypropionate and γ-butyrolactone; hydrocarbon solvents such as decahydronaphthalene; ketone solvents such as cyclohexanone; and alcohol solvents such as propylene glycol monomethyl ether, ethylene glycol monomethyl ether, dipropylene glycol monomethyl ether, diethylene glycol monomethyl ether, diethylene glycol monobutyl ether, ethylene glycol monophenyl ether and triethylene glycol monomethyl ether.

Of the above solvents, more suitable solvents may be appropriately selected in consideration of the solubility of the carboxyl group-containing polyurethanes according to the aspect (II), the effectiveness in bleeding prevention in printing and the drying properties of the solvents (namely, the boiling points of the solvents). Also, it may be taken into consideration that the solvent used in the production of the carboxyl group-containing polyurethane of the aspect (II) may be, without being replaced, used as the solvent for the carboxyl group-containing polyurethane solution in the aspect (III). In consideration of these viewpoints, at least one solvent may be preferably used which is selected from diethylene glycol diethyl ether, diethylene glycol ethyl methyl ether, diethylene glycol butyl methyl ether, diethylene glycol isopropyl methyl ether, triethylene glycol dimethyl ether, dipropylene glycol dimethyl ether, tripropylene glycol dimethyl ether, dipropylene glycol monomethyl ether acetate, dipropylene glycol monoethyl ether acetate, diethylene glycol monoethyl ether acetate, diethylene glycol monomethyl ether acetate and γ-butyrolactone.

Of the above solvents, a particularly preferred solvent includes at least one selected from diethylene glycol diethyl ether and γ-butyrolactone.

The carboxyl group-containing polyurethane solutions in the aspect (III) preferably have a solid concentration of 10 to 90% by mass, more preferably 15 to 70% by mass, and particularly preferably 20 to 60% by mass. When the carboxyl group-containing polyurethane solution has a solid concentration of 20 to 60% by mass, the viscosity of the solution measured under conditions described in the worked examples may be preferably in the range of 5,000 to 1,000,000 mPa·s from the viewpoint of uniform dispersion in the production of inventive curable compositions using the solution.

Next, processes for producing carboxyl group-containing polyurethanes in the aspect (IV) of the invention will be described.

The aspect (IV) of the invention is directed to a process for producing carboxyl group-containing polyurethanes which comprises reacting at least the following components (a), (b) and (c) at a temperature in the range of 30° C. to 160° C. in a solvent including at least one selected from the group consisting of diethylene glycol dimethyl ether, diethylene glycol diethyl ether, diethylene glycol ethyl methyl ether, diethylene glycol dibutyl ether, diethylene glycol butyl methyl ether, diethylene glycol isopropyl methyl ether, triethylene glycol dimethyl ether, triethylene glycol butyl methyl ether, tetraethylene glycol dimethyl ether, dipropylene glycol dimethyl ether, tripropylene glycol dimethyl ether, anisole, ethylene glycol monomethyl ether acetate, ethylene glycol monoethyl ether acetate, propylene glycol monomethyl ether acetate, propylene glycol monoethyl ether acetate, dipropylene glycol monomethyl ether acetate, dipropylene glycol monoethyl ether acetate, diethylene glycol monoethyl ether acetate, diethylene glycol monomethyl ether acetate, methyl methoxypropionate, ethyl methoxypropionate, methyl ethoxypropionate, ethyl ethoxypropionate, decahydronaphthalene, cyclohexanone and γ-butyrolactone;

component (a): the (poly)carbonate polyol according to the aspect (I) of the invention;

component (b): a polyisocyanate; and component (c): a carboxyl group-containing polyol.

In the processes for producing carboxyl group-containing polyurethanes in the aspect (IV), the following components (d), (e) and (f) may be appropriately selected and reacted together with the components (a), (b) and (c) as required.

Component (d): a polyol other than the components (a) and (c).

Component (e): a monohydroxy compound.

Component (f): a monoisocyanate compound.

The solvent used in the processes for producing carboxyl group-containing polyurethanes in the aspect (IV) includes at least one selected from diethylene glycol dimethyl ether, diethylene glycol diethyl ether, diethylene glycol ethyl methyl ether, diethylene glycol dibutyl ether, diethylene glycol butyl methyl ether, diethylene glycol isopropyl methyl ether, triethylene glycol dimethyl ether, triethylene glycol butyl methyl ether, tetraethylene glycol dimethyl ether, dipropylene glycol dimethyl ether, tripropylene glycol dimethyl ether, anisole, ethylene glycol monomethyl ether acetate, ethylene glycol monoethyl ether acetate, propylene glycol monomethyl ether acetate, propylene glycol monoethyl ether acetate, dipropylene glycol monomethyl ether acetate, dipropylene glycol monoethyl ether acetate, diethylene glycol monoethyl ether acetate, diethylene glycol monomethyl ether acetate, methyl methoxypropionate, ethyl methoxypropionate, methyl ethoxypropionate, ethyl ethoxypropionate, decahydronaphthalene, cyclohexanone and γ-butyrolactone.

In consideration of the solubility of the carboxyl group-containing polyurethanes according to the aspect (II), the effectiveness in bleeding prevention in printing and the drying properties of the solvents (namely, the boiling points of the solvents), the solvent used in the invention preferably includes at least one selected from diethylene glycol diethyl ether, diethylene glycol ethyl methyl ether, diethylene glycol butyl methyl ether, diethylene glycol isopropyl methyl ether, triethylene glycol dimethyl ether, dipropylene glycol dimethyl ether, tripropylene glycol dimethyl ether, dipropylene glycol monomethyl ether acetate, dipropylene glycol monoethyl ether acetate, diethylene glycol monoethyl ether acetate, diethylene glycol monomethyl ether acetate and γ-butyrolactone.

Of the above solvents, a particularly preferred solvent includes at least one selected from diethylene glycol diethyl ether and γ-butyrolactone.

In the processes according to the aspect (IV), carboxyl group-containing polyurethanes may be synthesized by reacting the components (a), (b) and (c) and optionally the components (d), (e) and (f) which may be selected as desired, using the above-described solvents in the presence or absence of a known urethane-forming catalyst such as dibutyl tin dilaurylate. The reaction is preferably performed in the absence of catalysts because the obtainable final products such as cured films achieve improved properties in actual use.

The materials may be fed in any sequence without limitation. In a usual embodiment, the components (a) and (c) optionally together with the component (d) are fed first and are dissolved in the solvent; thereafter at 30 to 140° C., more preferably 60 to 120° C., the component (b) is added dropwise; and these components are reacted together at 50 to 160° C., more preferably 60 to 150° C.

The molar ratio of the materials that are fed is controlled depending on the target molecular weight and acid value of the carboxyl group-containing polyurethanes. The component (e) may be used as an endcapping agent for the carboxyl group-containing polyurethanes. In detail, the component (e) may be added when the carboxyl group-containing polyurethane that is being produced by the process has reached (or has come close to) the target number average molecular weight, in order to endcap the terminal isocyanate groups of the carboxyl group-containing polyurethane under synthesis and thereby to suppress a further increase in number average molecular weight.

When the component (e) is used, the number of the isocyanate groups in the component (b) may be smaller than, equal to, or larger than the total number of the hydroxyl groups in the components (a), (c) and (d).

When the component (e) is used in excess, unreacted component (e) will result. Such excess component (e) may be used as part of the solvents or may be removed by distillation or the like.

The component (e) used as a material for the carboxyl group-containing polyurethanes suppresses the increase in molecular weight of the carboxyl group-containing polyurethanes. (Namely, it terminates the reaction.) The component (e) may be added dropwise to the solution at 30 to 150° C., more preferably 70 to 140° C., and thereafter the temperature is held constant to allow the reaction to complete.

In order that the component (f) is used as a material for the carboxyl group-containing polyurethanes, it is necessary that the components are used such that the number of the isocyanate groups in the component (b) is smaller than the total number of the hydroxyl groups of the components (a), (c) and (d). That is, these components should be used so that the carboxyl group-containing polyurethane under synthesis prior to the addition of the component (f) will have hydroxyl groups at terminals. After the substantial completion of the reaction of the hydroxyl groups in the components (a), (c) and (d) with the isocyanate groups in the component (b), the component (f) may be added dropwise to the solution of the carboxyl group-containing polyurethane under synthesis, at 30 to 150° C., more preferably 70 to 140° C., and thereafter the temperature is held constant to complete the reaction of the component (f) with the residual hydroxyl groups at terminals of the carboxyl group-containing polyurethane.

In the processes for producing carboxyl group-containing polyurethanes, the components may be used in amounts described below. The amount of the component (c) is preferably 1 to 32%, and more preferably 2 to 15% by mass of the total of the components (a), (b), (c) and (d). The ratio between the total number of the hydroxyl groups in the components (a), (b) and (c) and the number of the isocyanate groups in the component (b) is preferably 1:0.9 to 0.9:1, and more preferably 1:0.92 to 0.95:1. The amount of the component (a) relative to the total of the components (a) and (d) is preferably not less than 50% by mass, and more preferably not less than 60% by mass.

Next, curable compositions in the aspect (V) of the invention will be described.

The aspect (V) of the invention is directed to a curable composition that comprises the carboxyl group-containing polyurethane according to the aspect (II) of the invention, a solvent having a boiling point of 120 to 300° C., and a curing agent.

The carboxyl group-containing polyurethanes according to the aspect (II) that are components for the curable compositions in the aspect (V) are as described hereinabove.

The solvents having a boiling point of 120 to 300° C. that are components for the curable compositions in the aspect (V) are the same as the solvents for the carboxyl group-containing polyurethane solutions in the aspect (III) described hereinabove.

In the curable resin compositions according to the aspect (V), the solvent concentration is preferably 10 to 90% by mass, and more preferably 20 to 70% by mass.

The curing agents that are components for the curable compositions in the aspect (V) may be compounds having two or more epoxy groups in the molecule. Examples of the compounds having two or more epoxy groups in the molecule include novolac epoxy resins that result from the epoxidation of novolac resins obtained by acid-catalyzed condensation or co-condensation of phenols such as phenol, cresol, xylenol, resorcin and catechol and/or naphthols such as α-naphthol, β-naphthol and dihydroxynaphthalene, with aldehyde compounds such as formaldehyde, acetaldehyde, propionaldehyde, benzaldehyde and salicylaldehyde, with specific examples including phenol novolac epoxy resins and ortho cresol novolac epoxy resins; diglycidyl ethers of bisphenols A, bisphenols F, bisphenols S, alkyl-substituted or alkyl-unsubstituted biphenols and stilbene phenols (bisphenol A epoxy compounds, bisphenol F epoxy compounds, bisphenol S epoxy compounds, biphenyl epoxy compounds, stilbene epoxy compounds); glycidyl ethers of alcohols such as butanediol, polyethylene glycol and polypropylene glycol; glycidyl ester epoxy resins of carboxylic acids such as phthalic acid, isophthalic acid and tetrahydrophthalic acid; glycidyl or methylglycidyl epoxy resins that result from the substitution with the glycidyl group of the active hydrogen bonded to the nitrogen atom in compounds such as aniline, bis(4-aminophenyl)methane and isocyanuric acid; glycidyl or methylglycidyl epoxy resins that result from the substitution with the glycidyl group of the active hydrogen bonded to the nitrogen atom in compounds such as aminophenols, for example p-aminophenol, and the active hydrogen in the phenolic hydroxyl group in such compounds; alicyclic epoxy resins obtained by the epoxidation of olefin bonds in the molecule, such as vinylcyclohexene diepoxide, 3,4-epoxycyclohexylmethyl-3,4-epoxycyclohexane carboxylate and 2-(3,4-epoxy)cyclohexyl-5,5-spiro (3,4-epoxy)cyclohexane-m-dioxane; glycidyl ethers of para-xylylene-modified and/or meta-xylylene-modified phenolic resins; glycidyl ethers of terpene-modified phenolic resins; glycidyl ethers of dicyclopentadiene-modified phenolic resins; glycidyl ethers of cyclopentadiene-modified phenolic resins; glycidyl ethers of polycyclic aromatic ring-modified phenolic resins; glycidyl ethers of naphthalene ring-containing phenolic resins; halogenated phenol novolac epoxy resins; hydroquinone epoxy resins; trimethylolpropane epoxy resins; linear aliphatic epoxy resins that result from the oxidation of olefin bonds with peracids such as peracetic acid; diphenylmethane epoxy resins; epoxidized compounds of aralkyl phenolic resins such as phenol aralkyl resins and naphthol aralkyl resins; sulfur-containing epoxy resins; diglycidyl ether of tricyclo [5,2,1, $0^{2,6}$]decane dimethanol; and epoxy resins having an adamantane structure such as 1,3-bis(1-adamantyl)-4,6-bis(glycidyloyl)benzene, 1-[2',4'-bis(glycidyloyl)phenyl]adamantane, 1,3-bis(4'-glycidyloylphenyl)adamantane and 1,3-bis[2',4'-bis(glycidyloyl)phenyl]adamantane.

Of the compounds having two or more epoxy groups in the molecule as described above, compounds having two or more epoxy groups and an aromatic ring structure and/or an alicyclic structure in the molecule are preferable.

When a high premium is placed on the long-term electrical insulation performance of cured products according to the aspect (VI), compounds having two or more epoxy groups and having a tricyclodecane structure and an aromatic ring structure are preferable among the compounds having two or more epoxy groups and an aromatic ring structure and/or an alicyclic structure in the molecule. In detail, such preferred compounds are glycidyl ethers of dicyclopentadiene-modified phenolic resins (i.e., compounds having two or more epoxy groups and a tricyclo [5,2,1,$0^{2,6}$]decane structure and an aromatic ring structure), and epoxy resins having an adamantane structure such as 1,3-bis(1-adamantyl)-4,6-bis (glycidyloyl)benzene, 1-[2',4'-bis(glycidyloyl)phenyl]adamantane, 1,3-bis(4'-glycidyloylphenyl)adamantane and 1,3-bis[2',4'-bis(glycidyloyl)phenyl]adamantane (i.e., compounds having two or more epoxy groups and a tricyclo [3,3,1,1$^{3,7}$] decane structure and an aromatic ring structure). The use of these compounds leads to cured products having low water absorption. Particularly preferred compounds are represented by Formula (4) below:

[Chem. 12]

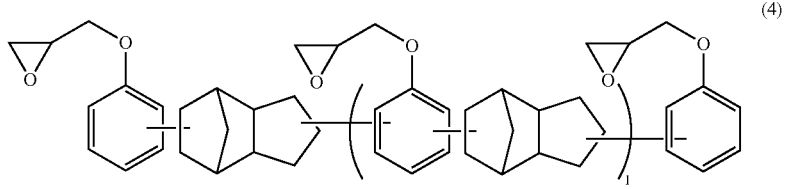

(4)

wherein l is an integer.

When an importance is placed on the reactivity with the carboxyl group-containing polyurethanes in the aspect (II), compounds having two or more epoxy groups and an amino group and an aromatic ring structure are preferable among the compounds having two or more epoxy groups and an aromatic ring structure and/or an alicyclic structure in the molecule. In detail, such preferred compounds are glycidyl or methylglycidyl epoxy resins that result from the substitution with the glycidyl group of the active hydrogen bonded to the nitrogen atom in compounds such as aniline and bis(4-aminophenyl)methane, and glycidyl or methylglycidyl epoxy resins that result from the substitution with the glycidyl group of the active hydrogen bonded to the nitrogen atom in compounds such as aminophenols, for example p-aminophenol, and the active hydrogen in the phenolic hydroxyl group in such compounds. Particularly preferred compounds are represented by Formula (5) below:

[Chem. 13]

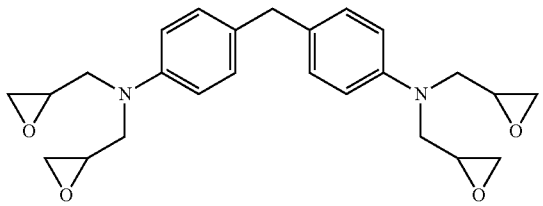

(5)

The compounds having two or more epoxy groups in the molecule may be used singly, or two or more kinds may be used in combination.

The amount of the curing agents based on 100 parts by mass of the carboxyl group-containing polyurethane in the aspect (II) may vary depending on the acid value of the carboxyl group-containing polyurethane in the aspect (II).

However, it is preferable that the ratio of the number of the carboxyl groups in the carboxyl group-containing polyurethane in the aspect (II) and that of the epoxy groups in the compound having two or more epoxy groups in the molecule is in the range of 1/3 to 2/1, and more preferably 1/2.5 to 1.5/1. If the ratio of the number of the carboxyl groups in the carboxyl group-containing polyurethane in the aspect (II) and that of the epoxy groups in the compound having two or more epoxy groups in the molecule is less than 1/3, a large amount of the compound having two or more epoxy groups in the molecule will remain unreacted and unfavorable consequences may result. If the ratio exceeds 2/1, a large amount of the carboxyl groups in the carboxyl group-containing polyurethane will remain unreacted, and thus such ratio is not preferable in view of electrical insulation performance.

The curable compositions according to the aspect (V) of the invention may contain, and preferably contain, curing accelerators. The curing accelerators are not particularly limited as long as the compounds can facilitate the reaction of the epoxy groups and the carboxyl groups. Examples include triazine compounds such as melamine, acetoguanamine, benzoguanamine, 2,4-diamino-6-methacryloyloxyethyl-s-triazine, 2,4-methacryloyloxyethyl-s-triazine, 2,4-diamino-6-vinyl-s-triazine and adduct of 2,4-diamino-6-vinyl-s-triazine with isocyanuric acid; imidazole compounds such as imidazole, 2-methylimidazole, 2-ethyl-4-methylimidazole, 2-phenylimidazole, 2-undecylimidazole, 2-heptadecylimidazole, 1-benzyl-2-methylimidazole, 2-phenyl-4-methylimidazole, 1-cyanoethyl-2-methylimidazole, 1-cyanoethyl-2-ethyl-4- methylimidazole, 1-aminoethyl-2-ethyl-4-methylimidazole, 1-aminoethyl-2-methylimidazole, 1-(cyanoethylaminoethyl)-2-methylimidazole, N-[2-(2-methyl-1-imidazolyl)ethyl]urea, 1-cyanoethyl-2-undecylimidazole, 1-cyanoethyl-2-methylimidazolium trimellitate, 1-cyanoethyl-2-phenylimidazolium trimellitate, 1-cyanoethyl-2-ethyl-4-methylimidazolium trimellitate, 1-cyanoethyl-2-undecylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 1-dodecyl-2-methyl-3-benzylimidazolium chloride, N,N'-bis(2-methyl-1-imidazolylethyl)urea, N,N'-bis(2-methyl-1-imidazolylethyl)adipamide, 2-phenyl-4-methyl-5-hydroxymethylimidazole, 2-phenyl-4,5-dihydroxymethylimidazole, adduct of 2-methylimidazole with isocyanuric acid, adduct of 2-phenylimidazole with isocyanuric acid, adduct of 2,4-diamino-6-[2'-methylimidazolyl-(1')]-ethyl-s-triazine with isocyanuric acid, 2-methyl-4-formylimidazole, 2-ethyl-4-methyl-5-formylimidazole, 2-phenyl-4-methylformylimidazole, 1-benzyl-2-phenylimidazole, 1,2-dimethylimidazole, 1-(2-hydroxyethyl)imidazole, vinylimidazole, 1-methylimidazole, 1-allylimidazole, 2-ethylimidazole, 2-butylimidazole, 2-butyl-5-hydroxymethylimidazole, 2,3-dihydro-1H-pyrrolo[1,2-a]benzimidazole, 1-benzyl-2-phenylimidazole hydrogen bromide and 1-dodecyl-2-methyl-3-benzylimidazolium chloride; cycloamidine compounds, for example diazabicycloalkenes, and cycloamidine compound derivatives, such as 1,5-diazabicyclo(4.3.0)nonene-5, salts thereof, 1,8-diazabicyclo(5.4.0)undecene-7 and salts thereof; amine compounds such as triethylenediamine, benzyldimethylamine, triethanolamine, dimethylaminoethanol and tris(dimethylaminomethyl)phenol; phosphine compounds such as triphenylphosphine, diphenyl(p-tolyl)phosphine, tris(alkylphenyl)phosphine, tris(alkoxyphenyl)phosphine, tris(alkyl alkoxyphenyl)phosphine, tris(dialkylphenyl)phosphine, tris(trialkylphenyl)phosphine, tris(tetraalkylphenyl)phosphine, tris(dialkoxyphenyl)phosphine, tris(trialkoxyphenyl)phosphine, tris(tetraalkoxyphenyl)phosphine, trialkylphosphine, dialkylarylphosphine and alkyldiarylphosphine; and dicyandiazide.

These curing accelerators may be used singly, or two or more kinds may be used in combination.

In view of the balance of the curing acceleration effects and the electrical insulating performance, melamine, imidazole compounds, cycloamidine compounds, cycloamidine compound derivatives, phosphine compounds and amine compounds are preferable, and melamine, 1,5-diazabicyclo(4.3.0)nonene-5, salts thereof, 1,8-diazabicyclo(5.4.0)undecene-7 and salts thereof are more preferable.

The amount of the curing accelerators is not particularly limited as long as curing acceleration effects are achieved. However, from the viewpoints of the curing properties of the curable compositions in the aspect (V) and the electrical insulating properties and the water resistance of cured products from the curable compositions in the aspect (V), the curing accelerators are preferably added in an amount of 0.05 to 5 parts by mass, and more preferably 0.1 to 3.0 parts by mass based on 100 parts by mass of the total of the carboxyl group-containing polyurethane and the curing agent in the curable composition according to the aspect (V). Quick curing is difficult if the amount is less than 0.05 parts by mass. Amounts in excess of 5 parts by mass can lead to deteriorations in electrical insulation properties and water resistance of cured products obtained by curing the curable compositions.

The curable compositions in the aspect (V) may contain, and preferably contain, inorganic fine particles and/or organic fine particles to control flowability.

Herein, the inorganic fine particles and/or the organic fine particles are defined to include not only inorganic fine particles and organic fine particles, but also organic-inorganic composite fine particles such as powdery inorganic compounds that are physically coated with organic compounds or are chemically surface-treated with organic compounds.

The inorganic fine particles and/or the organic fine particles that may be added to the curable compositions in the aspect (V) are not particularly limited as long as they can be dispersed in the carboxyl group-containing polyurethane in the aspect (II), the carboxyl group-containing polyurethane solution in the aspect (III), the curing agent, or the curing agent solution to give a paste.

Examples of the inorganic fine particles include silica ($SiO_2$), alumina ($Al_2O_3$), titania ($TiO_2$), tantalum oxide ($Ta_2O_5$), zirconia ($ZrO_2$), silicon nitride ($Si_3N_4$), barium titanate ($BaO.TiO_2$), barium carbonate ($BaCO_3$), lead titanate ($PbO.TiO_2$), lead zirconate titanate (PZT), lead lanthanum zirconate titanate (PLZT), gallium oxide ($Ga_2O_3$), spinel ($MgO.Al_2O_3$), mullite ($3Al_2O_3.2SiO_2$), cordierite ($2MgO.2Al_2O_3.5SiO_2$), talc ($3MgO.4SiO_2.H_2O$), aluminum titanate ($TiO_2$—$Al_2O_3$), yttria-containing zirconia ($Y_2O_3$—$ZrO_2$), barium silicate ($BaO.8SiO_2$), boron nitride (BN), calcium carbonate ($CaCO_3$), calcium sulfate ($CaSO_4$), zinc oxide (ZnO), magnesium titanate ($MgO.TiO_2$), barium sulfate ($BaSO_4$), organic bentonite and carbon (C). These may be used singly, or two or more kinds may be used in combination.

Preferred examples of the organic fine particles include fine particles of heat resistant resins having amide bonds, imide bonds, ester bonds or ether bonds. From the viewpoints of heat resistance and mechanical properties, polyimide resins, precursors thereof, polyamideimide resins, precursors thereof, and polyamide resins are preferable.

The inorganic fine particles and/or the organic fine particles preferably have an average particle diameter of 0.01 to 10 μm, and more preferably 0.1 to 5 μm.

The amount of the inorganic fine particles and/or the organic fine particles is 1 to 150 parts by mass, preferably 1 to 120 parts by mass, and more preferably 1 to 60 parts by mass based on 100 parts by mass of the total of the carboxyl group-containing polyurethane, the solvent and the curing agent contained in the curable resin composition.

The curable compositions in the aspect (V) can give cured products having good electrical insulating properties, and may be used to produce insulating protective films such as solder resists.

When the curable compositions in the aspect (V) are used for solder resists (namely, as solder resist ink compositions), antifoaming agents may be used, and are preferably used, in order to eliminate or suppress the occurrence of bubbles during printing.

The antifoaming agents are not particularly limited as long as they literally eliminate or suppress the occurrence of bubbles in printing the solder resist ink compositions.

Examples of the antifoaming agents for use in the curable compositions in the aspect (V) include silicone antifoaming agents such as BYK-077 (manufactured by BYK Japan K.K.), SN Defoamer 470 (manufactured by SAN NOPCO LIMITED), TSA750S (manufactured by Momentive Performance Materials Inc.) and Silicone Oil SH-203 (manufactured by Dow Corning Toray Co., Ltd.); acrylic polymer antifoaming agents such as Dappo SN-348 (manufactured by SAN NOPCO LIMITED), Dappo SN-354 (manufactured by SAN NOPCO LIMITED), Dappo SN-368 (manufactured by SAN NOPCO LIMITED) and DISPARLON 230HF (manufactured by Kusumoto Chemicals, Ltd.); acetylene diol antifoaming agents such as SURFYNOL DF-110D (manufactured by Nisshin Kagaku Kogyo K.K.) and SURFYNOL DF-37 (manufactured by Nisshin Kagaku Kogyo K.K.); and fluorine-containing silicone antifoaming agents such as FA-630.

Where necessary, the curable compositions in the aspect (V) of the invention may contain surfactants such as leveling agents, and known colorants such as phthalocyanine blue, phthalocyanine green, iodine green, disazo yellow, crystal violet, carbon black and naphthalene black.

When the resins should be prevented from oxidative deterioration or discoloration by heating, the curable compositions in the aspect (V) may contain, and preferably contain, antioxidants such as phenolic antioxidants, phosphite antioxidants and thioether antioxidants.

Examples of the phenolic antioxidants include compounds represented by Formulae (6) to (16) below:

[Chem. 14]

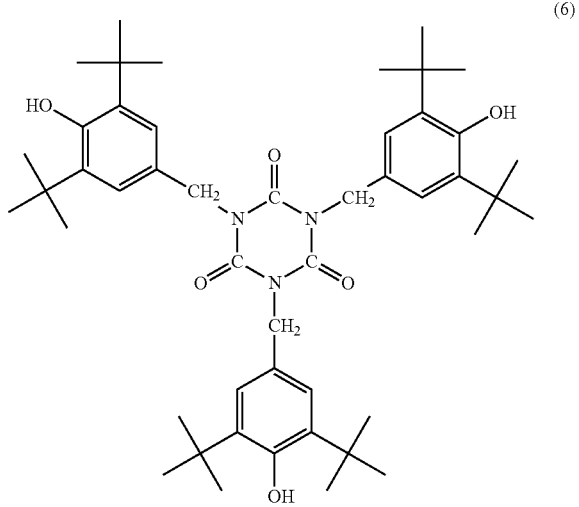

(6)

[Chem. 15]

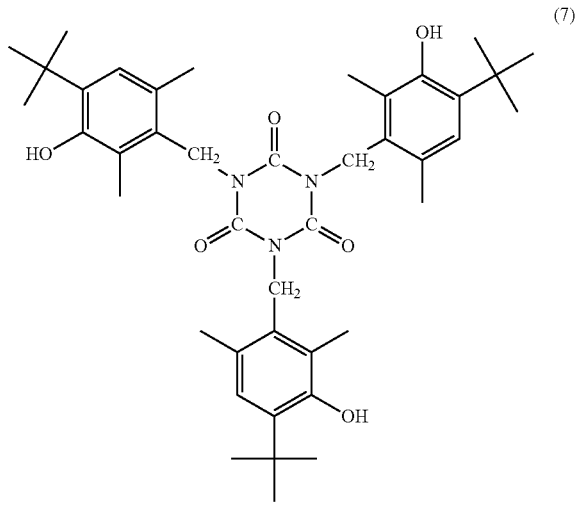

(7)

[Chem. 16]

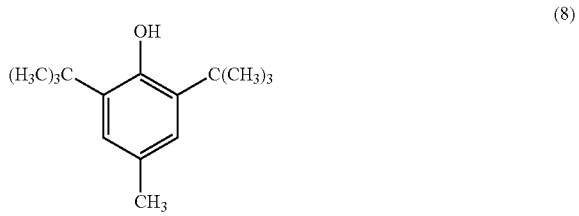

(8)

[Chem. 17]
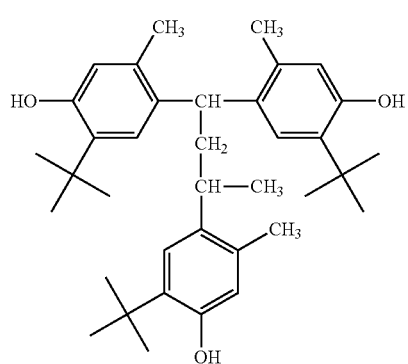
(9)
[Chem. 18]
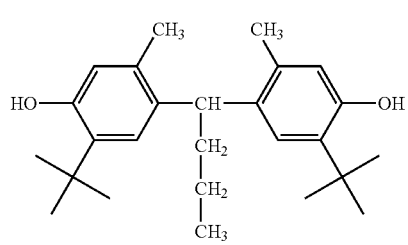
(10)
[Chem. 19]
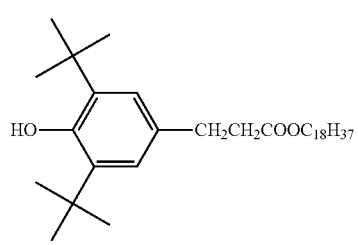
(11)
[Chem. 20]
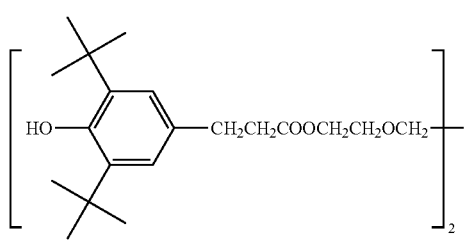
(12)

[Chem. 21]
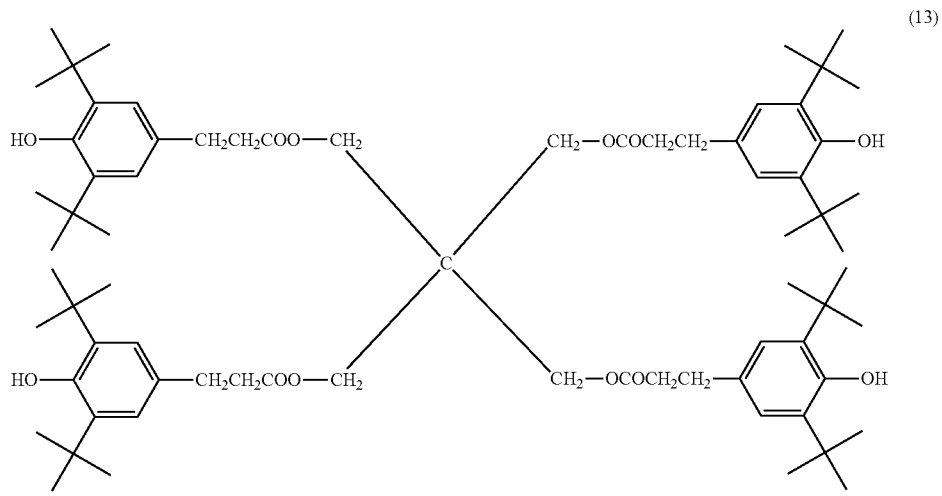
(13)
[Chem. 22]
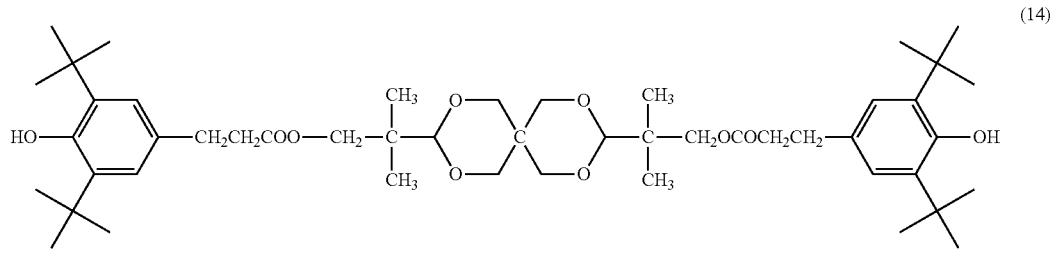
(14)
[Chem. 23]
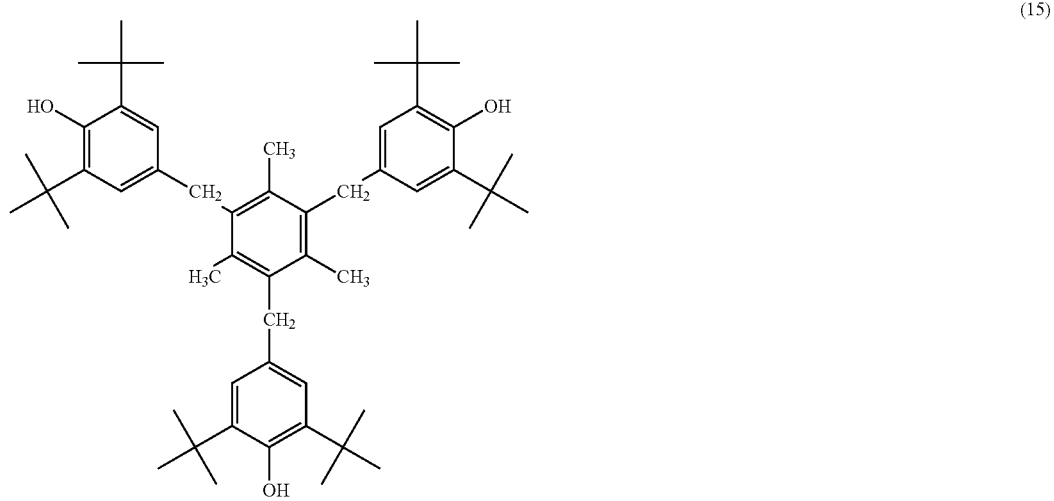
(15)
[Chem. 24]
(16)

In Formula (16), n is an integer of 1 to 5.
Examples of the phosphite antioxidants include compounds represented by Formulae (17) to (27) below:
[Chem. 25]
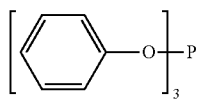
(17)
[Chem. 26]
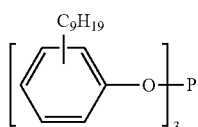
(18)
[Chem. 27]
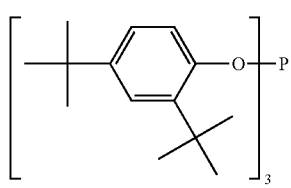
(19)
[Chem. 28]
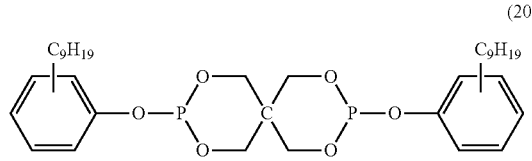
(20)
[Chem. 29]
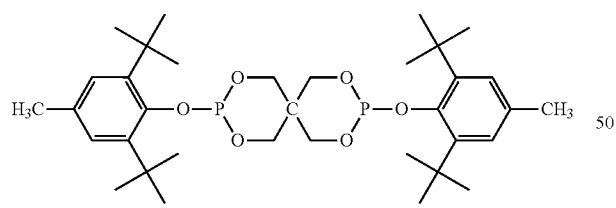
(21)
[Chem. 30]
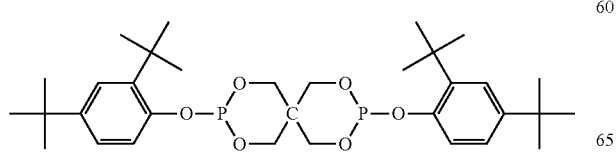
(22)
[Chem. 31]
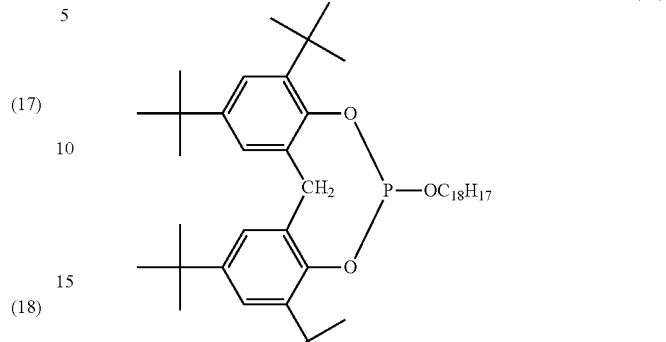
(23)
[Chem. 32]
(24)
[Chem. 33]
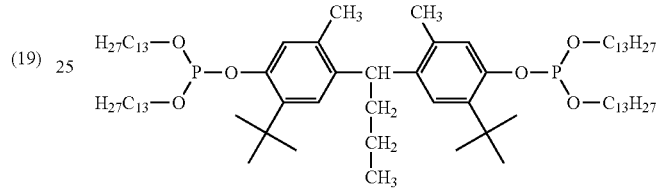
(25)
[Chem. 34]
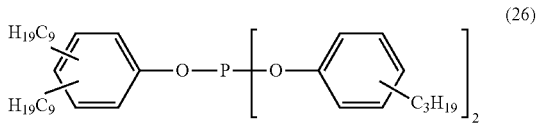
(26)
[Chem. 35]
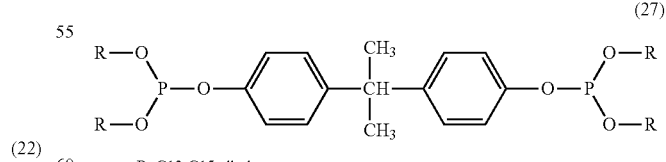
(27)
R: C12-C15 alkyl group
Examples of the thioether antioxidants include compounds represented by Formulae (28) to (33) below:

[Chem. 36]

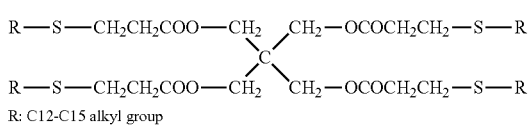

(28)

R: C12-C15 alkyl group

[Chem. 37]

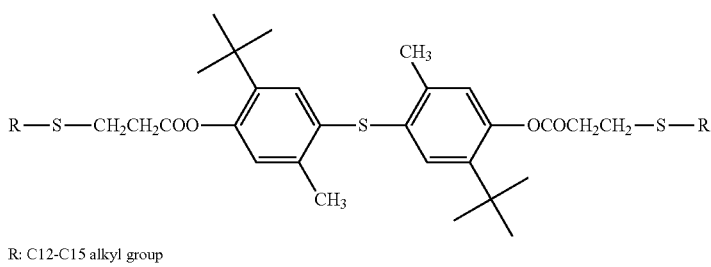

(29)

R: C12-C15 alkyl group

[Chem. 38]

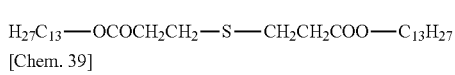

(30)

[Chem. 39]

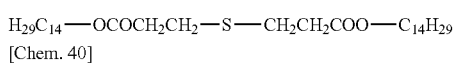

(31)

[Chem. 40]

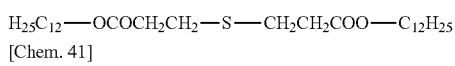

(32)

[Chem. 41]

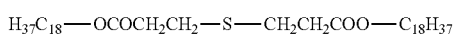

(33)

Further, flame retardants and lubricants may be added as required.

The curable compositions according to the aspect (V) may be obtained by homogeneously kneading and mixing some or all of the components using a roll mill, a bead mill or the like. When the mixing involves some of the components, the remaining component (s) may be mixed when the composition is actually used.

When the curable compositions in the aspect (V) are used as solder resist ink compositions, the compositions preferably have a thixotropic index in a specific range in order to achieve good printing properties of the curable compositions in the aspect (V).

As used herein, the thixotropic index is defined to be a ratio of the viscosity at 25° C. and 1 rpm and the viscosity at 25° C. and 10 rpm that are measured with a cone/plate viscometer (DV-II+Pro manufactured by Brookfield, spindle model: CPE-52).

When the curable compositions in the aspect (V) are used as solder resist ink compositions, the thixotropic index of the compositions at 25° C. is preferably in the range of 1.1 to 3.0, and more preferably 1.1 to 2.5 in order to achieve good printing properties of the curable compositions in the aspect (V). If the thixotropic index of the curable compositions at 25° C. is less than 1.1, the curable compositions in the aspect (V) used as solder resist ink compositions will flow after they are printed, and can consequently fail to provide the predetermined thickness or maintain the print patterns. If the thixotropic index of the curable compositions at 25° C. exceeds 3.0, films formed by printing the compositions may have bad antifoaming properties.

Next, cured products according to the aspect (VI) will be described.

The aspect (VI) of the invention is directed to a cured product obtainable by curing the curable resin composition according to the aspect (V) of the invention.

The cured products in the aspect (VI) are generally obtained by removing a part or the whole of the solvent in the curable composition in the aspect (V), and thereafter heating the resin to promote the curing reaction, resulting in a cured product. When the cured product in the aspect (VI) is obtained as a film as an example, the cured film may be produced by the following first to third steps.

First step: The curable composition in the aspect (V) is printed to give a coating film.

Second step: The coating film obtained in the first step is exposed to an atmosphere at 20° C. to 100° C. to evaporate a part or the whole of the solvent from the film.

Third step: The coating film obtained in the second step is thermally cured in an atmosphere at 100° C. to 250° C. to give a thermally cured film (namely, the cured product).

In the first step, the curable composition in the aspect (V) is printed to give a coating film. The methods for printing the curable composition in the aspect (V) are not particularly limited and include screen printing, roll coating, spraying and curtain coating.

In the second step, the coating film from the first step is exposed to an atmosphere at 20° C. to 100° C. to evaporate a part or the whole of the solvent from the film. The exposure time for removing the solvent is preferably not more than 4 hours, and more preferably not more than 2 hours.

In the third step, the coating film from the second step is thermally cured in an atmosphere at 100° C. to 250° C. to give a thermally cured film (namely, the cured product). The thermal curing time is preferably in the range of 20 minutes to 4 hours, and more preferably 30 minutes to 2 hours.

There will be described next flexible circuit boards in the aspect (VII) and processes for manufacturing flexible circuit boards covered with a protective film according to the aspect (VIII) of the invention.

The aspect (VII) of the invention is directed to a flexible circuit board covered with a cured product in which a circuit is formed on a flexible substrate, wherein the surface of the flexible substrate having the circuit is partially or entirely covered with the cured product according to the aspect (VI) of the invention.

The aspect (VIII) of the invention is directed to a process for manufacturing flexible circuit boards covered with a protective film, which comprises printing the curable composition of the aspect (V) to an area including a tin-plated circuit pattern of a flexible circuit board to form a print film on the pattern, and heating and curing the print film at 80 to 130° C. to produce a protective film.

The curable compositions of the aspect (V) may be used as, for example, solder resist inks, and the cured products in the aspect (VI) may be used as insulating protective films. In particular, the cured products may be used as solder resists that cover a part or the entire of the circuits in flexible circuit boards such as chip-on-film boards.

Hereinbelow, an embodiment of the production processes in the aspect (VIII) of the invention will be described. For example, a protective film may be formed on a flexible circuit board by the following steps A to C.

Step A: The curable composition of the aspect (V) is screen printed to an area including a tin-plated circuit pattern of a flexible circuit board to form a coating film. The coating film obtained in this step will be referred to as the print film.

Step B: The coating film obtained in the step A is exposed to an atmosphere at 20 to 100° C. to evaporate a part or the whole of the solvent from the film.

Step C: The film obtained in the step B is thermally cured in an atmosphere at 80 to 130° C. to give a thermally cured protective film on the flexible circuit board.

In the step B, the temperature for evaporating the solvent is 20 to 100° C., preferably 60 to 100° C., and more preferably 70 to 90° C. in view of the rate of the solvent evaporation and the quick shift to the subsequent step (the step C). The evaporation time for the solvent in the step B is not particularly limited, but is preferably 10 to 120 minutes, and more preferably 20 to 100 minutes. The procedures in the step B are optional, and the step A may be immediately followed by the step C to perform the curing reaction and the solvent removal simultaneously.

In order to prevent the diffusion of the plated layer and to obtain acceptable warpage and good flexibility of the protective film, the thermal curing in the step C is performed at a temperature in the range of 80 to 130° C., preferably 90 to 130° C., and more preferably 110 to 130° C. The thermal curing time in the step C is not particularly limited, but is preferably 20 to 150 minutes, and more preferably 30 to 120 minutes.

EXAMPLES

The present invention will be described in detail by presenting examples hereinbelow without limiting the scope of the invention.

<Measurement of Acid Value>

A carboxyl group-containing polyurethane solution according to the aspect (III) was distilled by heating under reduced pressure to evaporate the solvent. Thus, a carboxyl group-containing polyurethane according to the aspect (II) was obtained.

The carboxyl group-containing polyurethane was analyzed by a potentiometric titration method in accordance with JIS K0070 to determine the acid value.

The potentiometric titration method involved the following apparatus.

Apparatus: Automatic potentiometric titrator AT-510 manufactured by KYOTO ELECTRONICS MANUFACTURING CO., LTD.

Electrode: Composite glass electrode C-173 manufactured by KYOTO ELECTRONICS MANUFACTURING CO., LTD.

<Measurement of Hydroxyl Value of Component (a)/Component (d) Mixture>

The hydroxyl value of a mixture of a component (a) and a component (d) was measured by a neutralization titration method in accordance with JIS K0070.

<Measurement of Number Average Molecular Weight of Carboxyl Group-Containing Polyurethane>

The number average molecular weight was measured by GPC relative to polystyrenes. The GPC conditions were as follows.

Chromatograph: HPLC unit HSS-2000 manufactured by JASCO Corporation

Columns: Three Shodex columns LF-804 connected (in series)

Mobile phase: tetrahydrofuran

Flow rate: 1.0 ml/min

Detector: RI-2031 Plus manufactured by JASCO Corporation

Temperature: 40.0° C.

Sample amount: Sample loop 100 µl

Sample concentration: 0.1% by mass

<Measurement of Viscosity of Carboxyl Group-Containing Polyurethane Solution>

The viscosity of a carboxyl group-containing polyurethane solution was measured by the following method.

Approximately 0.8 g of a carboxyl group-containing polyurethane solution was analyzed with a cone/plate viscometer (DV-II+Pro manufactured by Brookfield, spindle model: CPE-52) at a temperature of 25.0° C. and a rotation of 5 rpm, and the viscosity after 7 minutes after the initiation of the measurement was determined.

<Measurement of Thixotropic Index>

The thixotropic index of a curable composition was measured by the following method.

Approximately 0.6 g of a curable composition was analyzed with a cone/plate viscometer (DV-II+Pro manufactured by Brookfield, spindle model: CPE-52) at a temperature of 25.0° C. and a rotation of 10 rpm, and the viscosity after 7 minutes after the initiation of the measurement was determined. Thereafter, the conditions were changed to a temperature of 25.0° C. and a rotation of 1 rpm, and the viscosity after 7 minutes after the initiation of the measurement was determined. With the viscosities obtained, the thixotropic index was determined.

In detail, the thixotropic index was calculated in the following manner.

Calculation of thixotropic index:

Thixotropic index=[viscosity at 1 rpm]÷[viscosity at 10 rpm]

<Synthesis of (Poly) Carbonate Polyols that have Organic Residue Derived from Dimer Diol and Organic Residue Derived from Polyol having C10-20 Alicyclic Structure>

Example 1

A 1000 ml four-necked round-bottom flask equipped with a stirrer, a thermometer and a fractionator was charged with 150.2 g (0.937 mol) of a mixture (product name: PD-9, manufactured by KYOWA HAKKO CHEMICAL CO., LTD.) containing 2,4-diethyl-1,5-pentanediol and 2-ethyl-2-butyl-1,3-propanediol, 128.7 g (0.656 mol) of tricyclo[5.2.1.0$^{2,6}$]decanedimethanol (manufactured by Tokyo Chemical Industry Co., Ltd.), 150.2 g of PRIPOL 2033 (dimer diol 98.2% by mass, monool 0.6% by mass, trimer triol 1.2% by mass, hydroxyl value 205 mg KOH/g), 166.3 g (1.408 mol) of diethyl carbonate (manufactured by Wako Pure Chemical Industries, Ltd.), and 1.717 g (5.04 mmol) of tetra-n-butyl titanate (manufactured by MITSUBISHI GAS CHEMICAL COMPANY, INC.). A nitrogen flow was continuously supplied for 30 minutes and was thereafter terminated. The materials were then heated using an oil bath set at 150° C. Ethanol containing a small amount of diethyl carbonate which resulted with the progress of the reaction was distilled from the fractionator and was collected in a 300 ml recovery flask. The distillation rate of ethanol was observed to decrease, and the oil bath temperature was gradually increased and was finally raised to 200° C. Thereafter, the 1000 ml four-necked round-bottom flask was gradually evacuated with the progress of the reaction, and the pressure was finally reduced to 5333 Pa. The reaction was carried out for a total of 8 hours. Thereafter, the ethanol distilled which contained a small amount of diethyl carbonate was analyzed by gas chromatography to determine the mass of diethyl carbonate contained in the ethanol. Diethyl carbonate was newly added in a mass corresponding to the mass of the diethyl carbonate that had been distilled away. The oil bath was set at a temperature of 190° C., and the reaction was initiated again and was performed at atmospheric pressure for 2 hours. During the reaction, the oil bath temperature was gradually increased to 200° C. Thereafter, the 1000 ml four-necked round-bottom flask was gradually evacuated, and the pressure was finally reduced to 5333 Pa. The reaction was carried out for a total of 12 hours from the initiation of the reaction. After the completion of the reaction, a light yellow viscous liquid (hereinafter, the product A1) was obtained in the 1000 ml four-necked round-bottom flask.

The product A1 was analyzed by gas chromatography. The analysis showed that 2,4-diethyl-1,5-pentanediol, 2-ethyl-2-butyl-1,3-propanediol and tricyclo [5.2.1.0$^{2,6}$]decanedimethanol remained in the product A1 at 7.1% by mass, 0.3% by mass and 4.2% by mass, respectively. Liquid chromatography of the product A1 showed that the dimer diol remained in the product A1 at 5.5% by mass, and the amounts of the residual monool and trimer triol were below the detection limits.

The hydroxyl value of the product A1 was 123 mg KOH/g.

Figure 2:
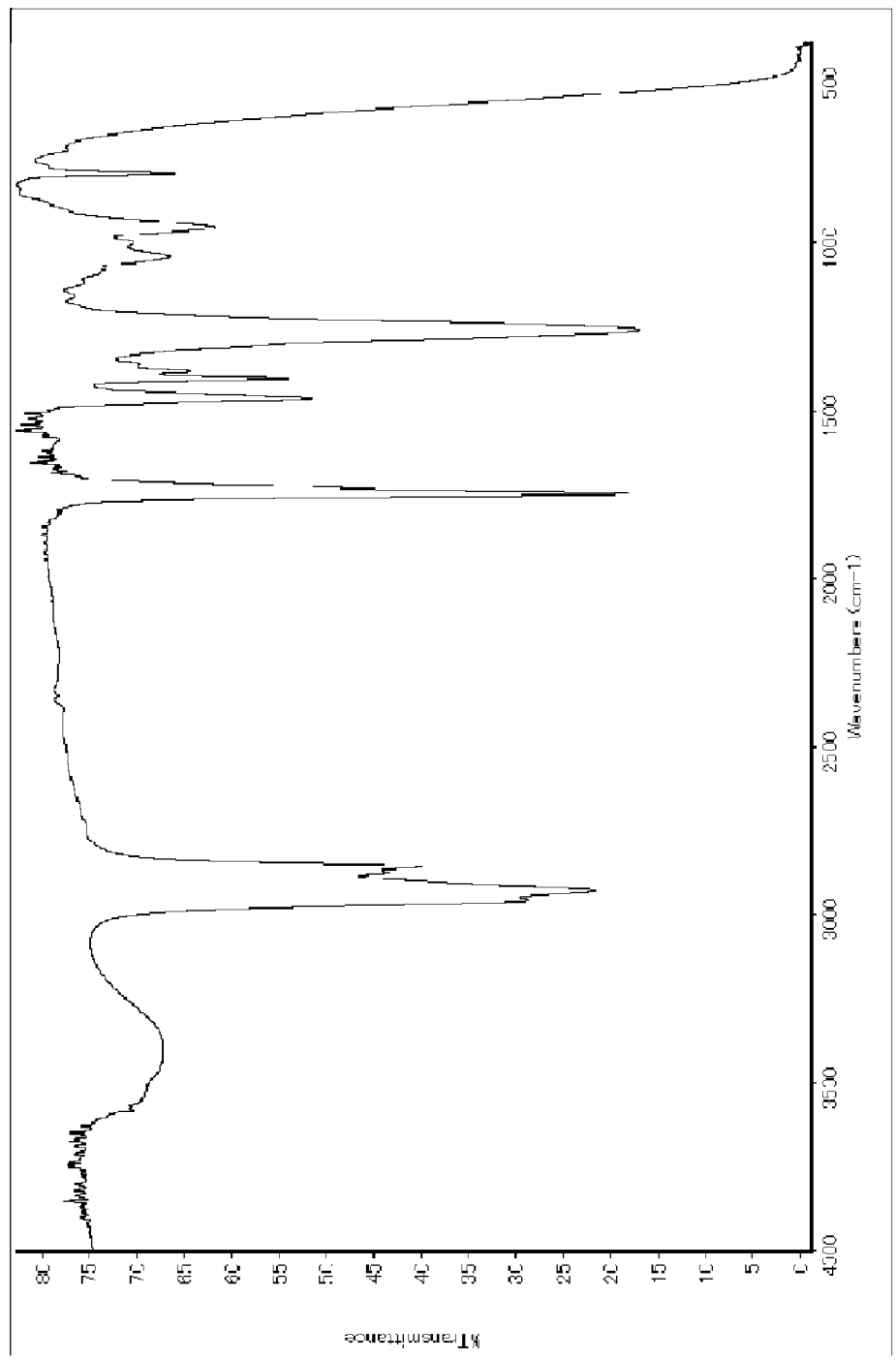
FIG. 2 is an IR spectrum of the product A1 in Examples.

FIGS. 1 and 2 show a $^1$H-NMR spectrum (solvent: CDCl$_3$) and an IR spectrum, respectively, of the product A1.

Example 2

A 500 ml four-necked round-bottom flask equipped with a stirrer, a thermometer and a fractionator was charged with 117.8 g (0.600 mol) of tricyclo [5.2.1.0$^{2,6}$]decanedimethanol (manufactured by Tokyo Chemical Industry Co., Ltd.), 162.6 g of PRIPOL 2033 (dimer diol 98.2% by mass, monool 0.6% by mass, trimer triol 1.2% by mass, hydroxyl value 205 mg KOH/g), 70.878 g (0.600 mol) of diethyl carbonate (manufactured by Wako Pure Chemical Industries, Ltd.), and 1.405 g (4.1 mmol) of tetra-n-butyl titanate (manufactured by MITSUBISHI GAS CHEMICAL COMPANY, INC.). A nitrogen flow was continuously supplied for 30 minutes and was thereafter terminated. The materials were then heated using an oil bath set at 150° C. Ethanol containing a small amount of diethyl carbonate which resulted with the progress of the reaction was distilled from the fractionator and was collected in a 300 ml recovery flask. The distillation rate of ethanol was observed to decrease, and the oil bath temperature was gradually increased and was finally raised to 200° C. Thereafter, the 500 ml four-necked round-bottom flask was gradually evacuated with the progress of the reaction, and the pressure was finally reduced to 5333 Pa. The reaction was carried out for a total of 8 hours. Thereafter, the ethanol distilled which contained a small amount of diethyl carbonate was analyzed by gas chromatography to determine the mass of diethyl carbonate contained in the ethanol. Diethyl carbonate was newly added in a mass corresponding to the mass of the diethyl carbonate that had been distilled away. The oil bath was set at a temperature of 190° C., and the reaction was initiated again and was performed at atmospheric pressure for 2 hours. During the reaction, the oil bath temperature was gradually increased to 200° C. Thereafter, the 500 ml four-necked round-bottom flask was gradually evacuated, and the pressure was finally reduced to 5333 Pa. The reaction was carried out for a total of 12 hours from the initiation of the reaction. After the completion of the reaction, a light yellow viscous liquid (hereinafter, the product A2) was obtained in the 500 ml four-necked round-bottom flask.

The product A2 was analyzed by gas chromatography. The analysis showed that tricyclo[5.2.1.0$^{2,6}$]decanedimethanol remained in the product A2 at 16.3% by mass. Liquid chromatography of the product A1 showed that the dimer diol remained in the product A2 at 5.9% by mass, and the amounts of the residual monool and trimer triol were below the detection limits.

The hydroxyl value of the product A2 was 123 mg KOH/g.

Figure 3:
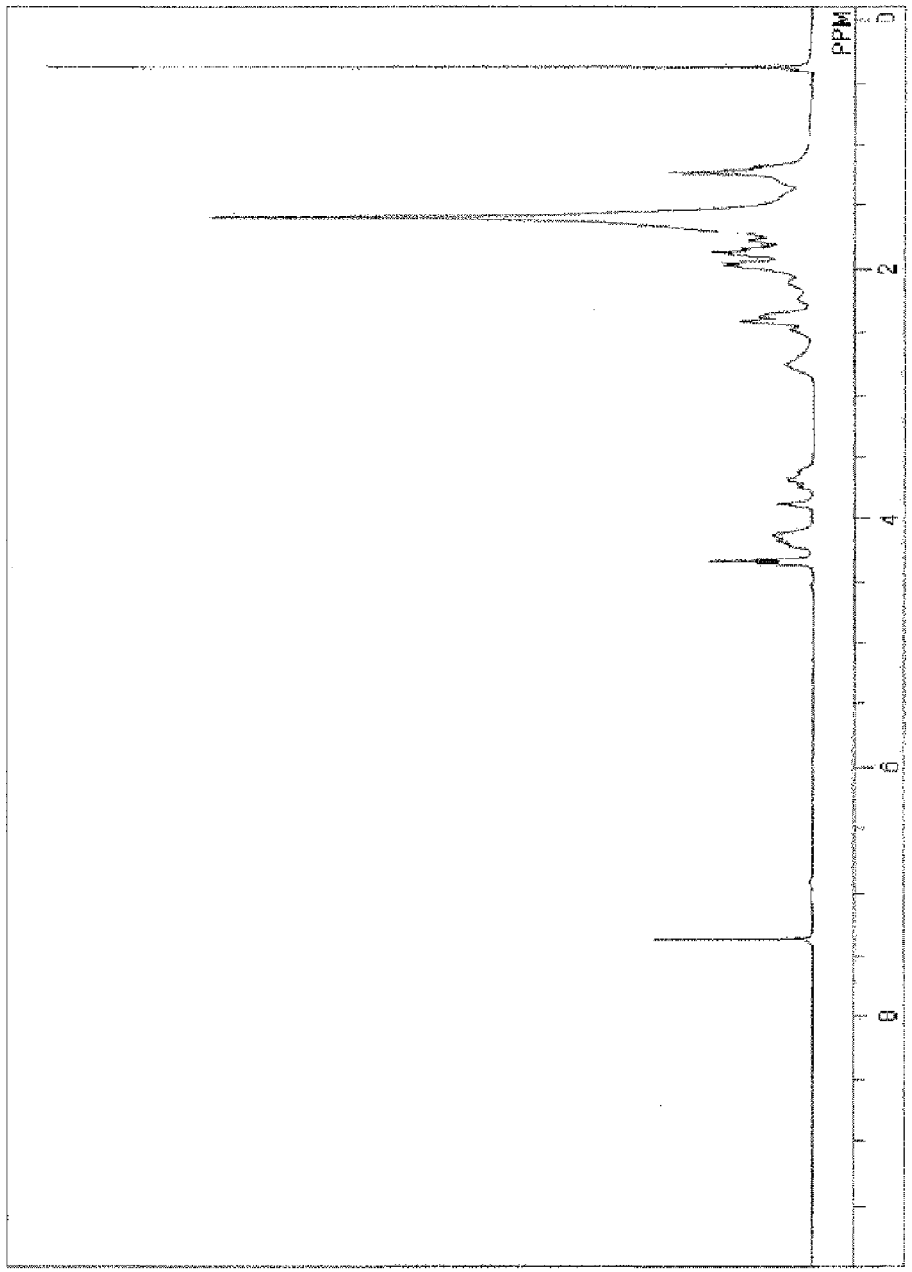
FIG. 3 is a $^1$H-NMR spectrum (solvent: $CDCl_3$) of a product A2 in Examples.
Figure 4:
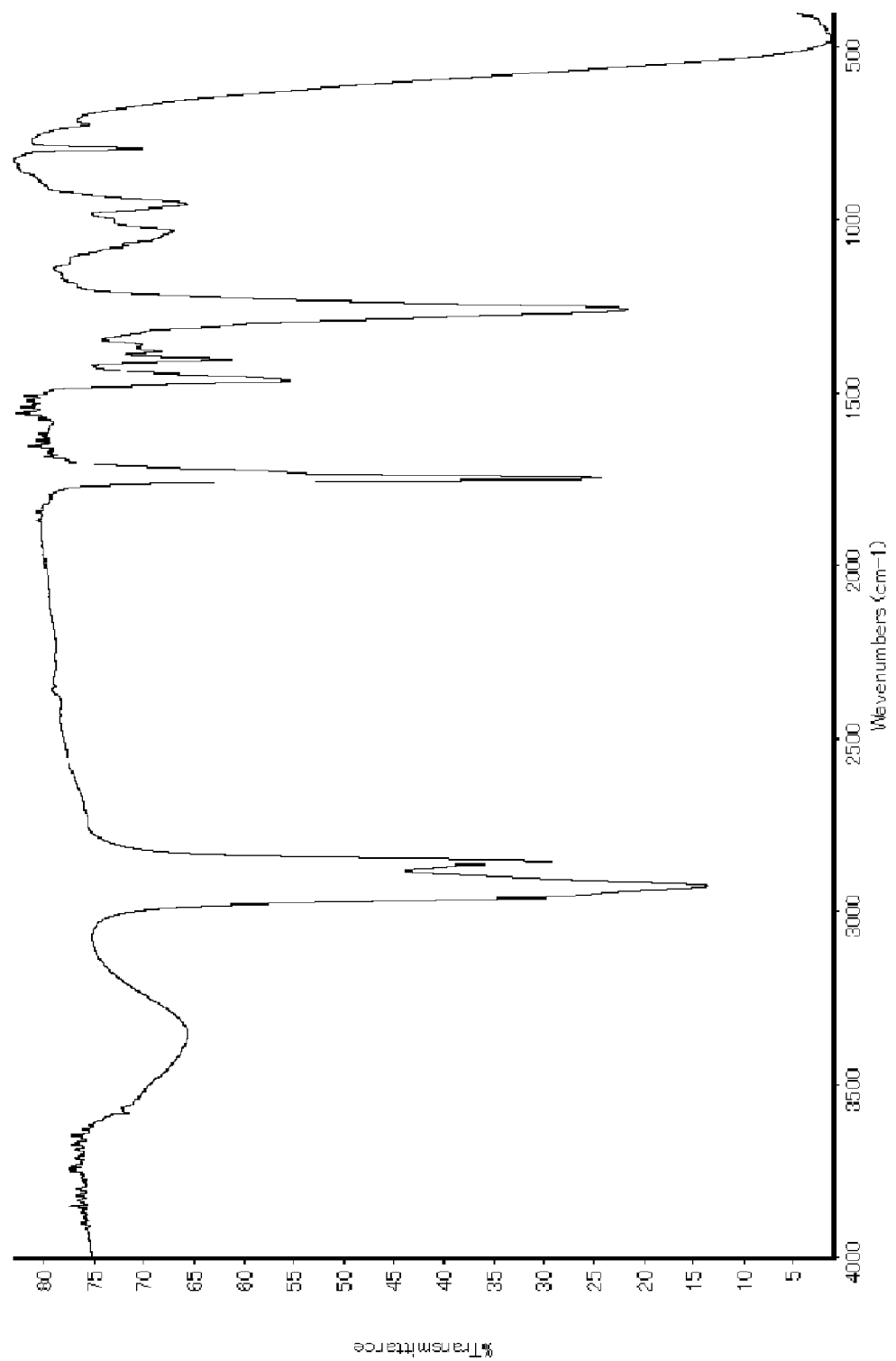
FIG. 4 is an IR spectrum of the product A2 in Examples.

FIGS. 3 and 4 show a $^1$H-NMR spectrum (solvent: CDCl$_3$) and an IR spectrum, respectively, of the product A2.

Example 3

A 500 ml four-necked round-bottom flask equipped with a stirrer, a thermometer and a fractionator was charged with 68.6 g (0.426 mol) of a mixture (product name: PD-9, manufactured by KYOWA HAKKO CHEMICAL CO., LTD.) containing 2,4-diethyl-1,5-pentanediol and 2-ethyl-2-butyl-1,3-propanediol, 68.6 g (0.349 mol) of tricyclo[5.2.1.0$^{2,6}$]decanedimethanol (manufactured by Tokyo Chemical Industry Co., Ltd.), 68.6 g of PRIPOL 2033 (dimer diol 98.2% by mass, monool 0.6% by mass, trimer triol 1.2% by mass, hydroxyl value 205 mg KOH/g), 81.8 g (0.693 mol) of diethyl carbonate (manufactured by Wako Pure Chemical Industries, Ltd.), and 0.823 g (2.42 mmol) of tetra-n-butyl titanate (manufactured by MITSUBISHI GAS CHEMICAL COMPANY, INC.). A nitrogen flow was continuously supplied for 30 minutes and was thereafter terminated. The materials were then heated using an oil bath set at 150° C. Ethanol containing a small amount of diethyl carbonate which resulted with the progress of the reaction was distilled from the fractionator and was collected in a 300 ml recovery flask. The distillation rate of ethanol was observed to decrease, and the oil bath temperature was gradually increased and was finally raised to 200° C. Thereafter, the 500 ml four-necked round-bottom flask was gradually evacuated with the progress of the reaction, and the pressure was finally reduced to 5333 Pa. The reaction was carried out for a total of 8 hours. Thereafter, the ethanol distilled which contained a small amount of diethyl carbonate was analyzed by gas chromatography to determine the mass of diethyl carbonate contained in the ethanol. Diethyl carbonate was newly added in a mass corresponding to the mass of the diethyl carbonate that had been distilled away. The oil bath was set at a temperature of 190° C., and the reaction was initiated again and was performed at atmospheric pressure for 2 hours. During the reaction, the oil bath temperature was gradually increased to 200° C. Thereafter, the 500 ml four-necked round-bottom flask was gradually evacuated, and the pressure was finally reduced to 5333 Pa. The reaction was carried out for a total of 12 hours from the initiation of the reaction. After the completion of the reaction, a light yellow viscous liquid (hereinafter, the product A3) was obtained in the 500 ml four-necked round-bottom flask.

The product A3 was analyzed by gas chromatography. The analysis showed that 2,4-diethyl-1,5-pentanediol, 2-ethyl-2-butyl-1,3-propanediol and tricyclo[5.2.1.0$^{2,6}$]decanedimethanol remained in the product A3 at 4.2% by mass, 0.3% by mass and 4.5% by mass, respectively. Liquid chromatography of the product A3 showed that the dimer diol remained in the product A3 at 5.0% by mass, and the amounts of the residual monool and trimer triol were below the detection limits.

The hydroxyl value of the product A3 was 110 mg KOH/g.

Figure 5:
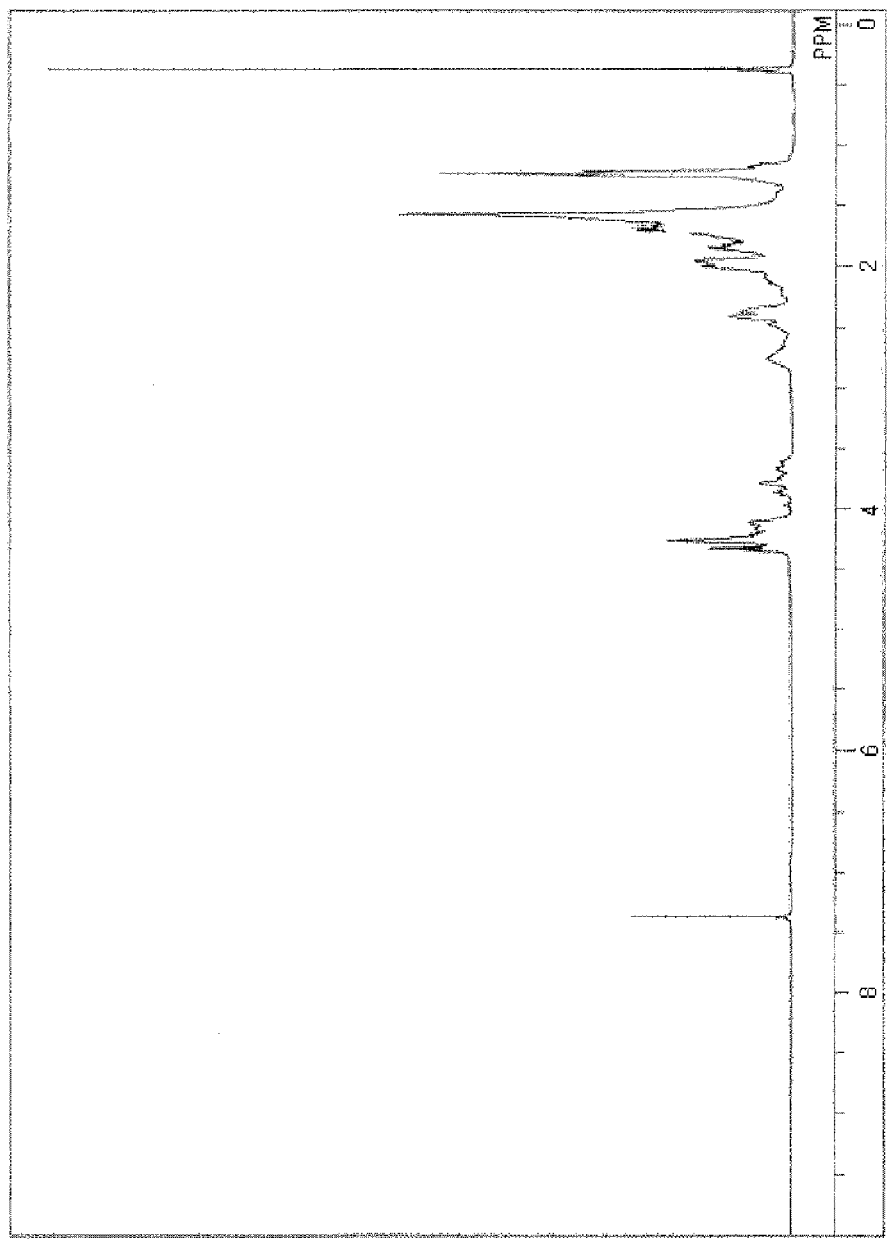
FIG. 5 is a $^1$H-NMR spectrum (solvent: $CDCl_3$) of a product A3 in Examples.
Figure 6:
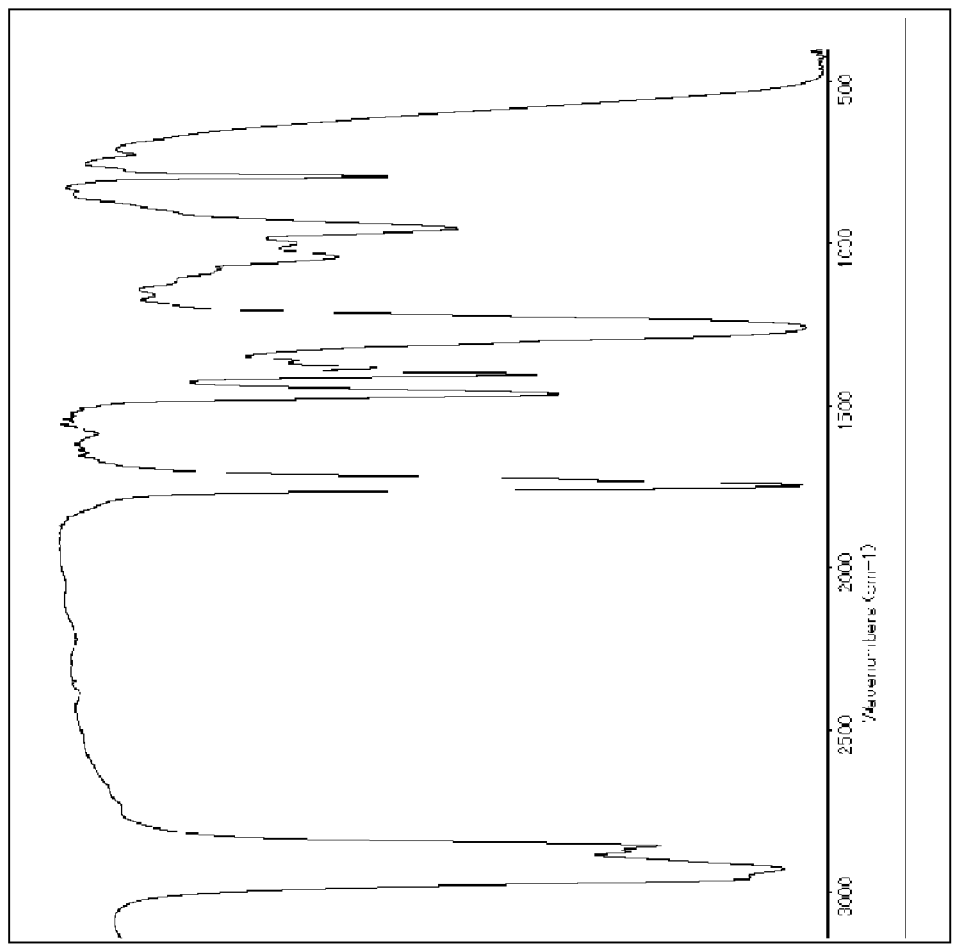
FIG. 6 is an IR spectrum of the product A3 in Examples.

FIGS. 5 and 6 show a $^1$H-NMR spectrum (solvent: CDCl$_3$) and an IR spectrum, respectively, of the product A3.

Example 4

A 1000 ml four-necked round-bottom flask equipped with a stirrer, a thermometer and a fractionator was charged with 150.2 g (0.937 mol) of a mixture (product name: ND-15, manufactured by KURARAY CO., LTD.) containing 2-methyl-1,8-octanediol and 1,9-nonanediol, 150.2 g (0.765 mol) of tricyclo[5.2.1.0$^{2,6}$]decanedimethanol (manufactured by Tokyo Chemical Industry Co., Ltd.), 150.2 g of PRIPOL 2033 (dimer diol 98.2% by mass, monool 0.6% by mass, trimer triol 1.2% by mass, hydroxyl value 205 mg KOH/g), 179.2 g (1.517 mol) of diethyl carbonate (manufactured by Wako Pure Chemical Industries, Ltd.), and 1.802 g (5.30 mmol) of tetra-n-butyl titanate (manufactured by MITSUBISHI GAS CHEMICAL COMPANY, INC.). A nitrogen flow was continuously supplied for 30 minutes and was thereafter terminated. The materials were then heated using an oil bath set at 150° C. Ethanol containing a small amount of diethyl carbonate which resulted with the progress of the reaction was distilled from the fractionator and was collected in a 300 ml recovery flask. The distillation rate of ethanol was observed to decrease, and the oil bath temperature was gradually increased and was finally raised to 200° C. Thereafter, the 1000 ml four-necked round-bottom flask was gradually evacuated with the progress of the reaction, and the pressure was finally reduced to 5333 Pa. The reaction was carried out for a total of 8 hours. Thereafter, the ethanol distilled which contained a small amount of diethyl carbonate was analyzed by gas chromatography to determine the mass of diethyl carbonate contained in the ethanol. Diethyl carbonate was newly added in a mass corresponding to the mass of the diethyl carbonate that had been distilled away. The oil bath was set at a temperature of 190° C., and the reaction was initiated again and was performed at atmospheric pressure for 2 hours. During the reaction, the oil bath temperature was gradually increased to 200° C. Thereafter, the 1000 ml four-necked round-bottom flask was gradually evacuated, and the pressure was finally reduced to 5333 Pa. The reaction was carried out for a total of 12 hours from the initiation of the reaction. After the completion of the reaction, a light yellow viscous liquid (hereinafter, the product A5) was obtained in the 1000 ml four-necked round-bottom flask.

The product A5 was analyzed by gas chromatography. The analysis showed that 2-methyl-1,8-octanediol, 1,9-nonanediol and tricyclo[5.2.1.0$^{2,6}$]decanedimethanol remained in the product A5 at 0.2% by mass, 0.1% by mass and 10.1% by mass, respectively. Liquid chromatography of the product A5 showed that the dimer diol remained in the product A5 at 5.0% by mass, and the amounts of the residual monool and trimer triol were below the detection limits.

The hydroxyl value of the product A5 was 116 mg KOH/g.

Figure 7:
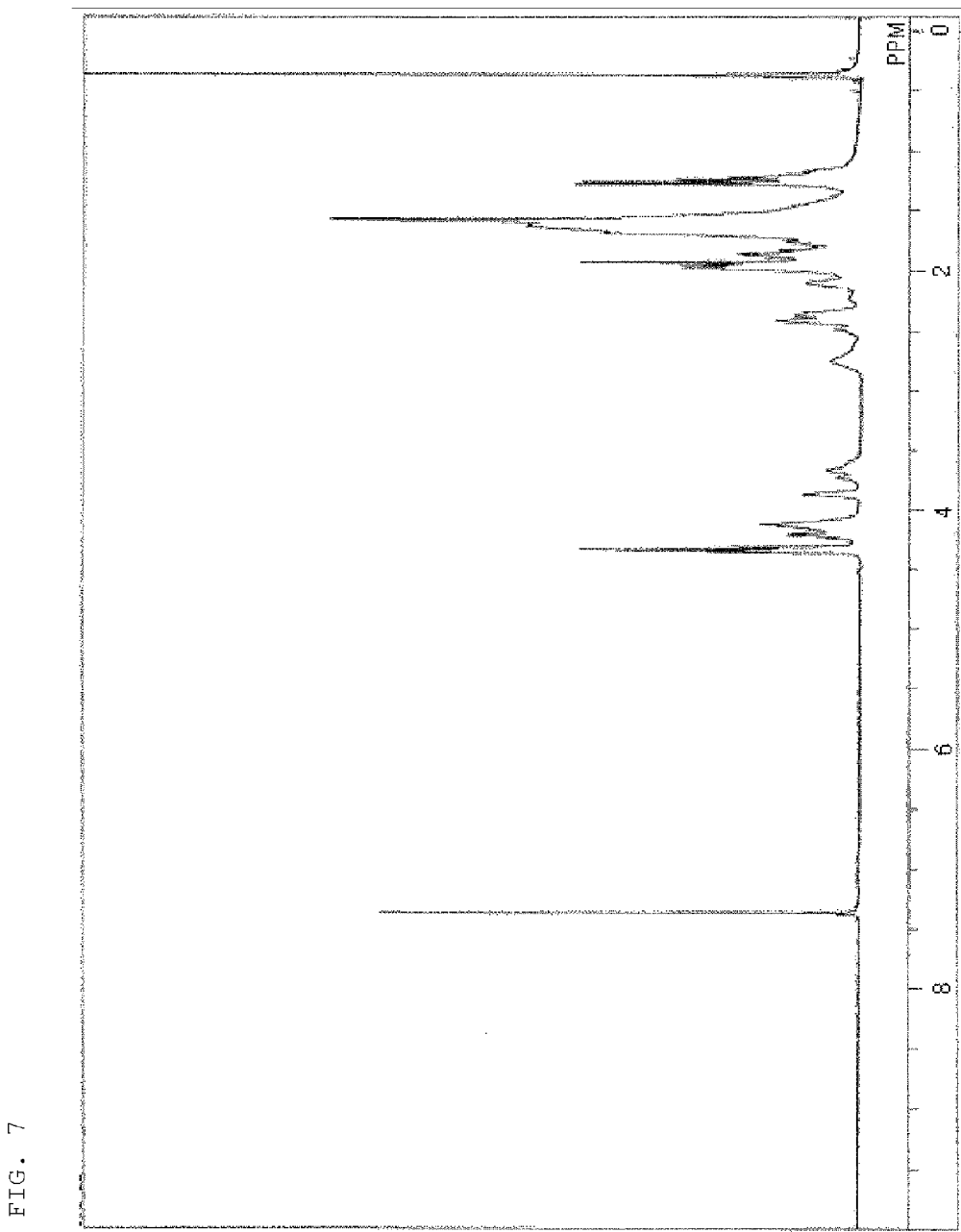
FIG. 7 is a $^1$H-NMR spectrum (solvent: $CDCl_3$) of a product A4 in Examples.
Figure 8:
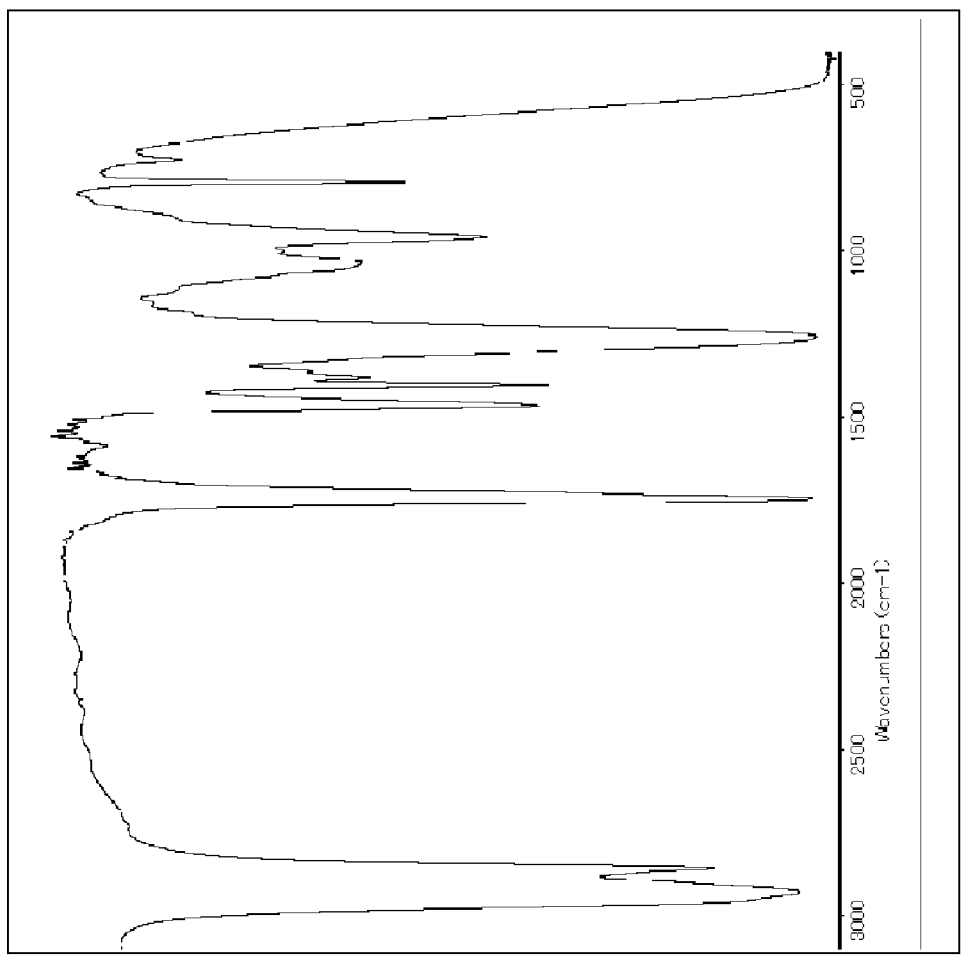
FIG. 8 is an IR spectrum of the product A4 in Examples.

FIGS. 7 and 8 show a $^1$H-NMR spectrum (solvent: CDCl$_3$) and an IR spectrum, respectively, of the product A5.

<Synthesis of Carboxyl Group-Containing Polyurethanes>

Example 5

A reactor equipped with a stirrer, a thermometer and a condenser was charged with 271.4 g of the product A1 from Example 1, 35.7 g of 2,2-dimethylolbutanoic acid (manufactured by Nippon Kasei Chemical Co., Ltd.) as a carboxyl group-containing diol, and 330.0 g and 220.0 g of γ-butyrolactone (manufactured by Mitsubishi Chemical Corporation) and diethylene glycol diethyl ether (manufactured by Nippon Nyukazai Co., Ltd.), respectively, as solvents. The materials were heated to 100° C. and were completely dissolved. The temperature of the reaction liquid was lowered to 90° C., and 139.0 g of methylenebis(4-cyclohexylisocyanate) (product name: DESMODUR W, manufactured by Sumika Bayer Urethane Co., Ltd.) as a polyisocyanate was added dropwise with a dropping funnel over a period of 30 minutes. Thereafter, a reaction was performed at 120° C. for 6 hours. When the substantial disappearance of the isocyanate was confirmed, 4.0 g of isobutanol (manufactured by Wako Pure Chemical Industries, Ltd.) was added dropwise and a reaction was performed at 120° C. for 3 hours. Thus, a carboxyl group-containing polyurethane solution (hereinafter, the carboxyl group-containing polyurethane solution B1) was obtained.

The carboxyl group-containing polyurethane solution B1 had a viscosity of 11500 mPa·s. The carboxyl group-containing polyurethane contained in the carboxyl group-containing polyurethane solution B1 (hereinafter, the carboxyl group-containing polyurethane BU1) had a number average molecular weight of 14000. The acid value of the carboxyl group-containing polyurethane BU1 was 30.0 mg KOH/g.

The carboxyl group-containing polyurethane solution B1 had a solid concentration of 45.0% by mass.

Figure 9:
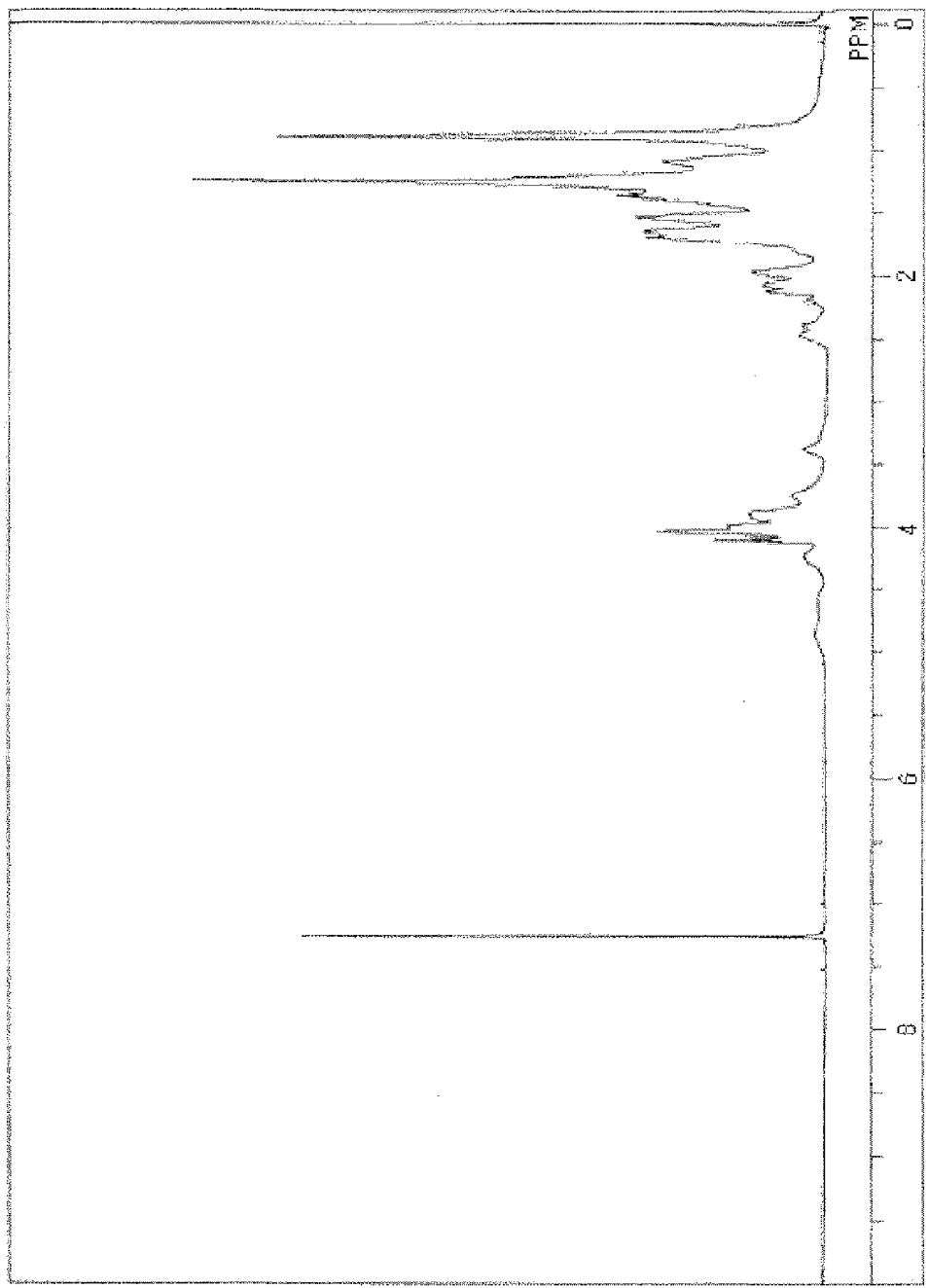
FIG. 9 is a $^1$H-NMR spectrum (solvent: $CDCl_3$) of a carboxyl group-containing polyurethane BU1 in Examples.
Figure 10:
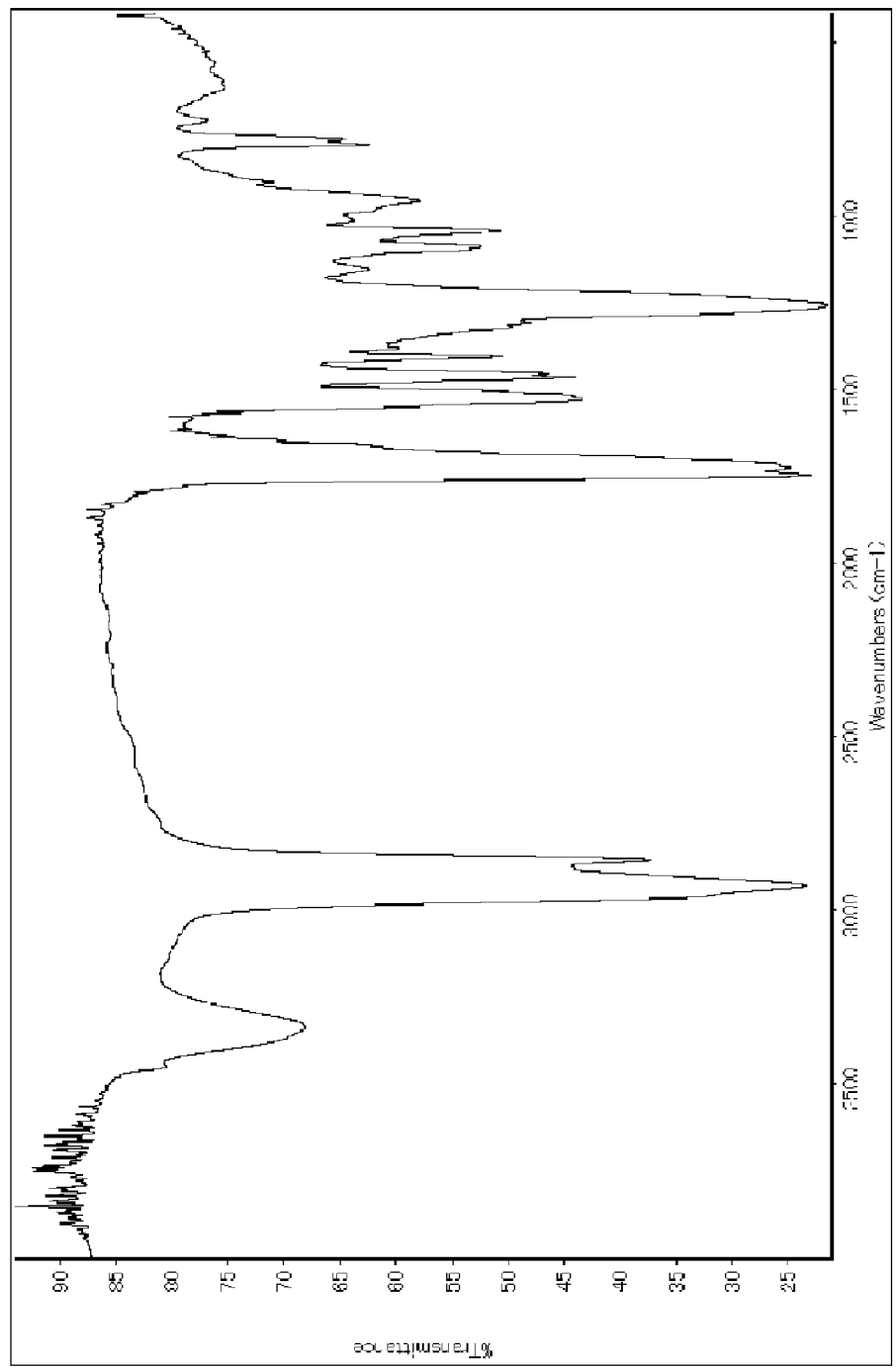
FIG. 10 is an IR spectrum of the carboxyl group-containing polyurethane BU1 in Examples.

FIGS. 9 and 10 show a $^1$H-NMR spectrum (solvent: CDCl$_3$) and an IR spectrum, respectively, of the carboxyl group-containing polyurethane BU1.

Example 6

A reactor equipped with a stirrer, a thermometer and a condenser was charged with 204.5 g of the product A2 from Example 2, 33.1 g of a mixture (product name: PD-9, manufactured by KYOWA HAKKO CHEMICAL CO., LTD.) containing 2,4-diethyl-1,5-pentanediol and 2-ethyl-2-butyl-1,3-propanediol, 35.7 g of 2,2-dimethylolbutanoic acid (manufactured by Nippon Kasei Chemical Co., Ltd.) as a carboxyl group-containing diol, and 250.0 g and 250.0 g of γ-butyrolactone (manufactured by Mitsubishi Chemical Corporation) and diethylene glycol diethyl ether (manufactured by Nippon Nyukazai Co., Ltd.), respectively, as solvents. The materials were heated to 100° C. and were completely dissolved. The temperature of the reaction liquid was lowered to 90° C., and 176.5 g of methylenebis(4-cyclohexyl isocyanate) (product name: DESMODUR W, manufactured by Sumika Bayer Urethane Co., Ltd.) as a polyisocyanate was added dropwise with a dropping funnel over a period of 30 minutes. Thereafter, a reaction was performed at 120° C. for 6 hours. When the substantial disappearance of the isocyanate was confirmed, 4.0 g of isobutanol (manufactured by Wako Pure Chemical Industries, Ltd.) was added dropwise and a reaction was performed at 120° C. for 3 hours. Thus, a carboxyl group-containing polyurethane solution (hereinafter, the carboxyl group-containing polyurethane solution B2) was obtained.

The carboxyl group-containing polyurethane solution B2 had a viscosity of 301000 mPa·s. The carboxyl group-containing polyurethane contained in the carboxyl group-containing polyurethane solution B2 (hereinafter, the carboxyl group-containing polyurethane BU2) had a number average molecular weight of 14000. The acid value of the carboxyl group-containing polyurethane BU2 was 30.0 mg KOH/g.

The carboxyl group-containing polyurethane solution B2 had a solid concentration of 45.0% by mass.

Figure 11:
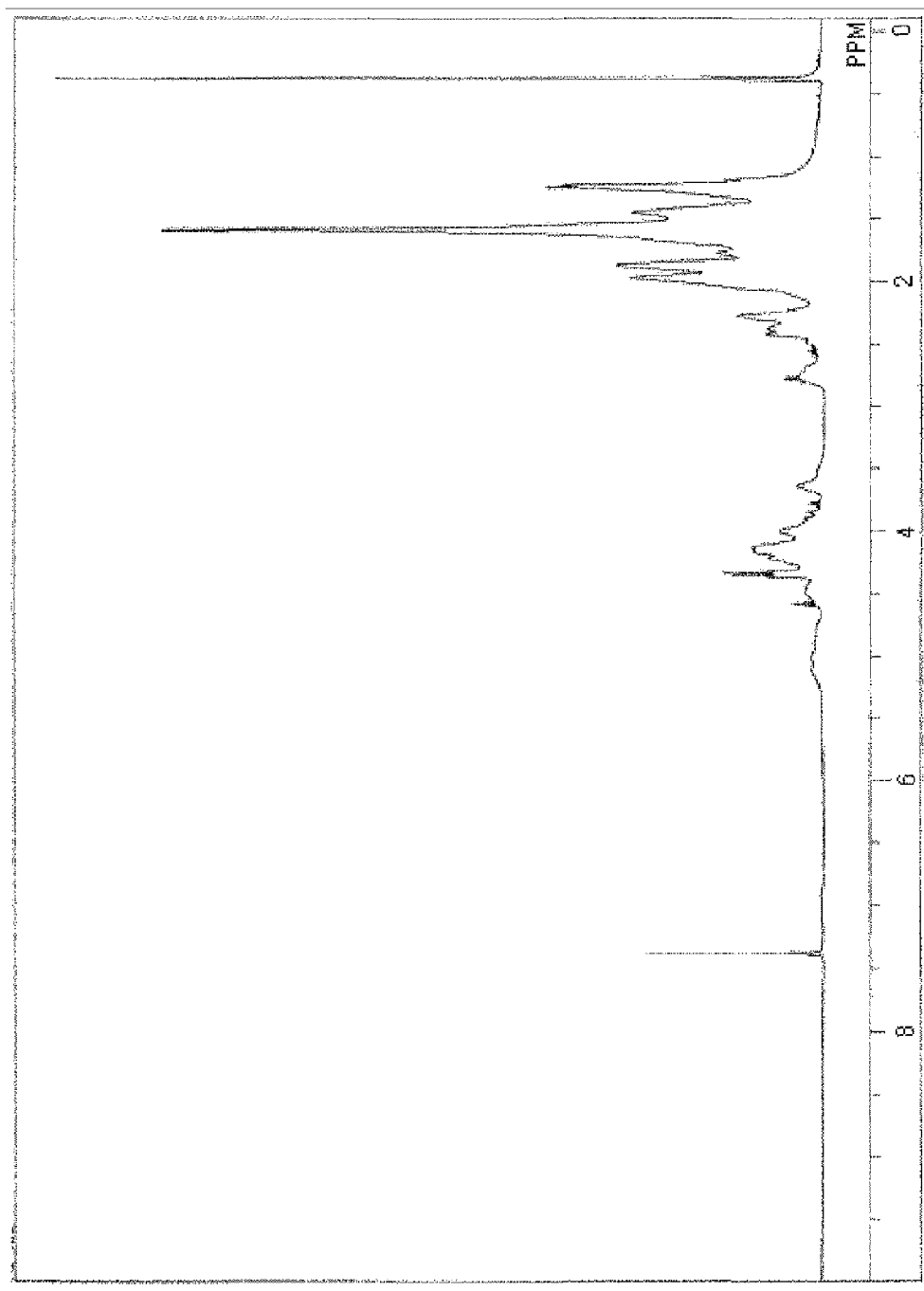
FIG. 11 is a $^1$H-NMR spectrum (solvent: $CDCl_3$) of a carboxyl group-containing polyurethane BU2 in Examples.
Figure 12:
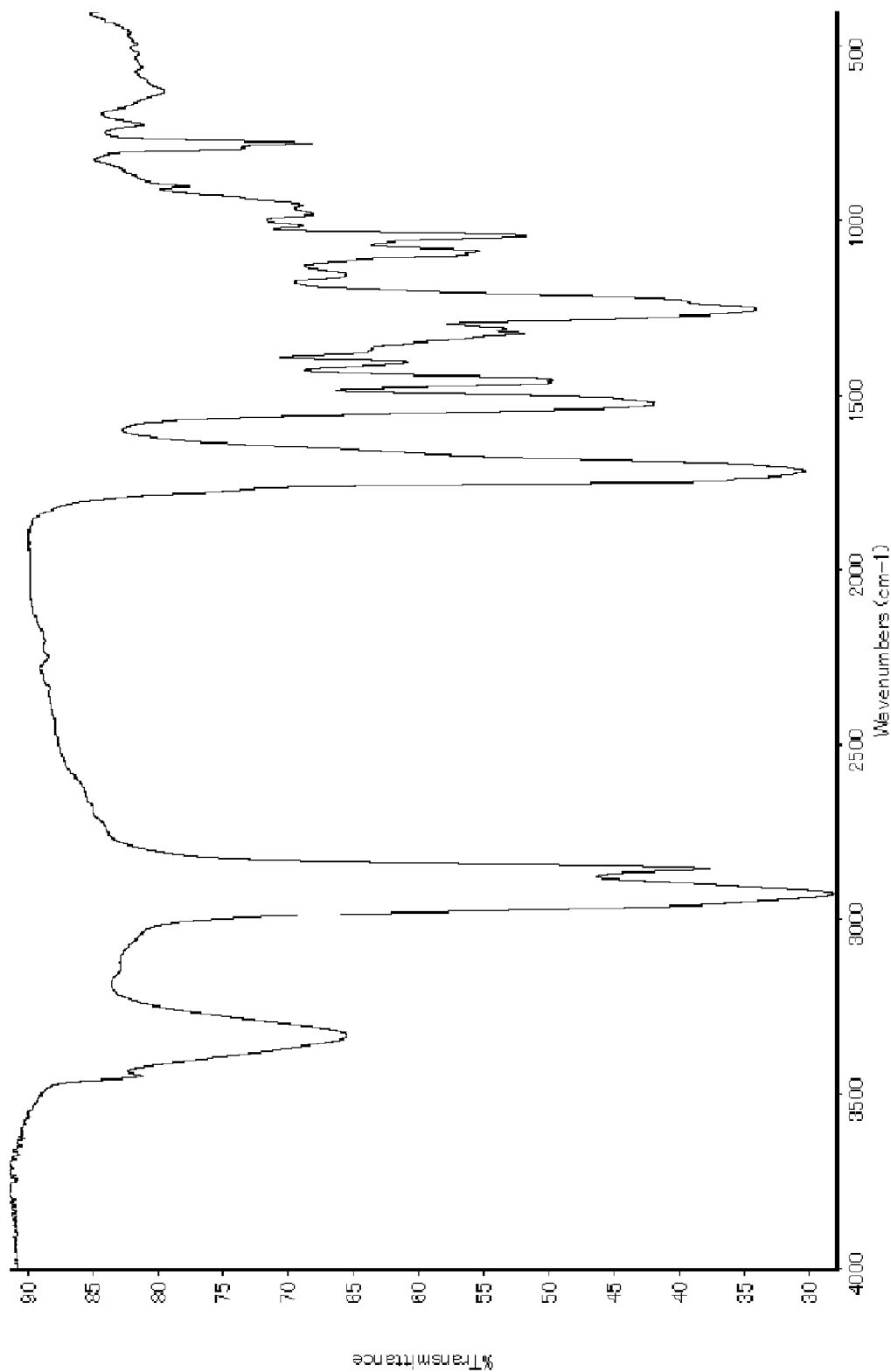
FIG. 12 is an IR spectrum of the carboxyl group-containing polyurethane BU2 in Examples.

FIGS. 11 and 12 show a $^1$H-NMR spectrum (solvent: CDCl$_3$) and an IR spectrum, respectively, of the carboxyl group-containing polyurethane BU2.

Example 7

A reactor equipped with a stirrer, a thermometer and a condenser was charged with 277.7 g of the product A3 from Example 3, 35.7 g of 2,2-dimethylolbutanoic acid (manufactured by Nippon Kasei Chemical Co., Ltd.) as a carboxyl group-containing diol, and 330.0 g and 220.0 g of γ-butyrolactone (manufactured by Mitsubishi Chemical Corporation) and diethylene glycol diethyl ether (manufactured by Nippon Nyukazai Co., Ltd.), respectively, as solvents. The materials were heated to 100° C. and were completely dissolved. The temperature of the reaction liquid was lowered to 90° C., and 132.6 g of methylenebis (4-cyclohexyl isocyanate) (product name: DESMODUR W, manufactured by Sumika Bayer Urethane Co., Ltd.) as a polyisocyanate was added dropwise with a dropping funnel over a period of 30 minutes. Thereafter, a reaction was performed at 120° C. for 6 hours. When the substantial disappearance of the isocyanate was confirmed, 4.0 g of isobutanol (manufactured by Wako Pure Chemical Industries, Ltd.) was added dropwise and a reaction was performed at 120° C. for 3 hours. Thus, a carboxyl group-containing polyurethane solution (hereinafter, the carboxyl group-containing polyurethane solution B3) was obtained.

The carboxyl group-containing polyurethane solution B3 had a viscosity of 12000 mPa·s. The carboxyl group-containing polyurethane contained in the carboxyl group-containing polyurethane solution B3 (hereinafter, the carboxyl group-containing polyurethane BU3) had a number average molecular weight of 14000. The acid value of the carboxyl group-containing polyurethane BU3 was 30.0 mg KOH/g.

The carboxyl group-containing polyurethane solution B3 had a solid concentration of 45.0% by mass.

Figure 13:
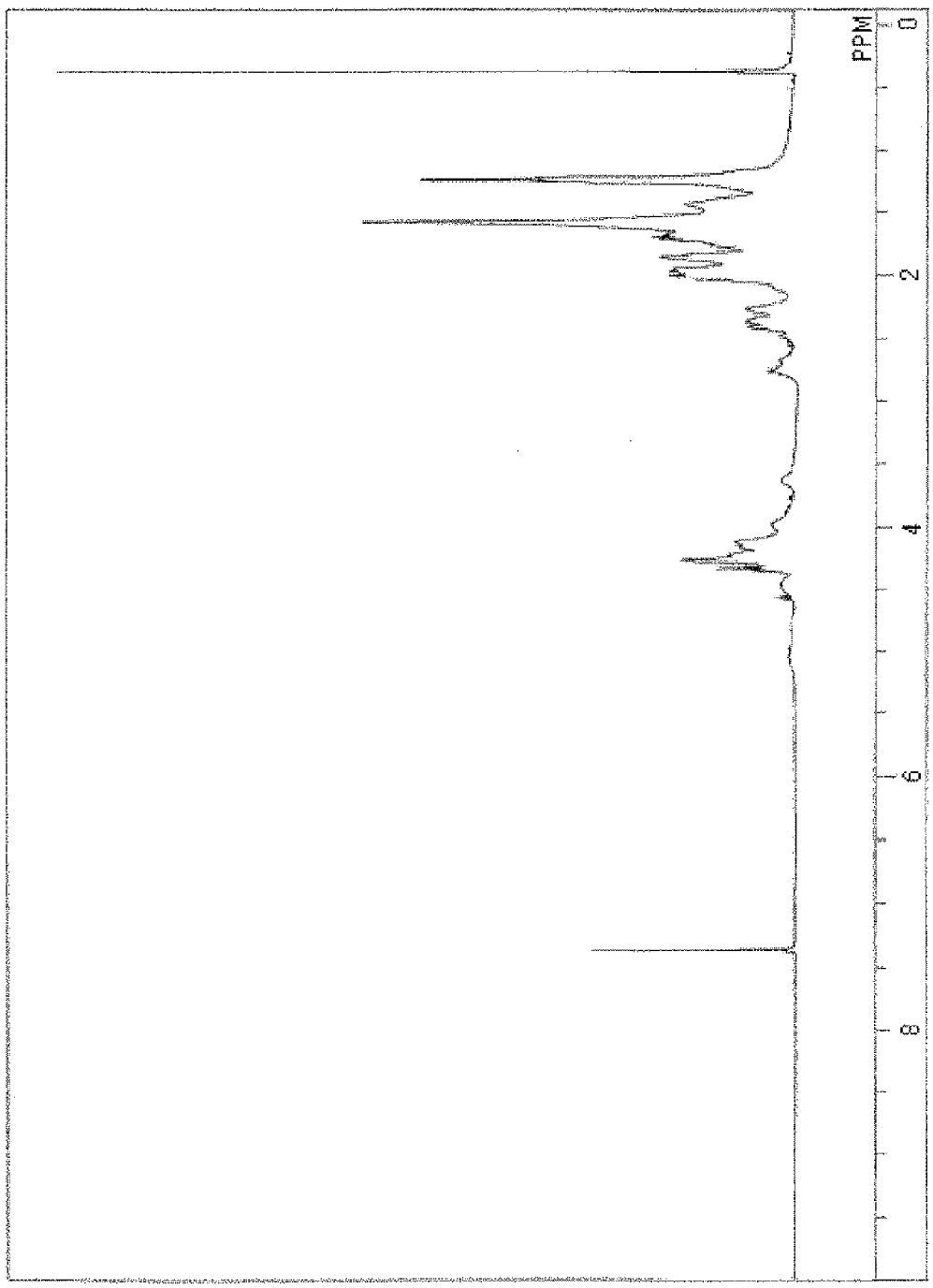
FIG. 13 is a $^1$H-NMR spectrum (solvent: $CDCl_3$) of a carboxyl group-containing polyurethane BU3 in Examples.
Figure 14:
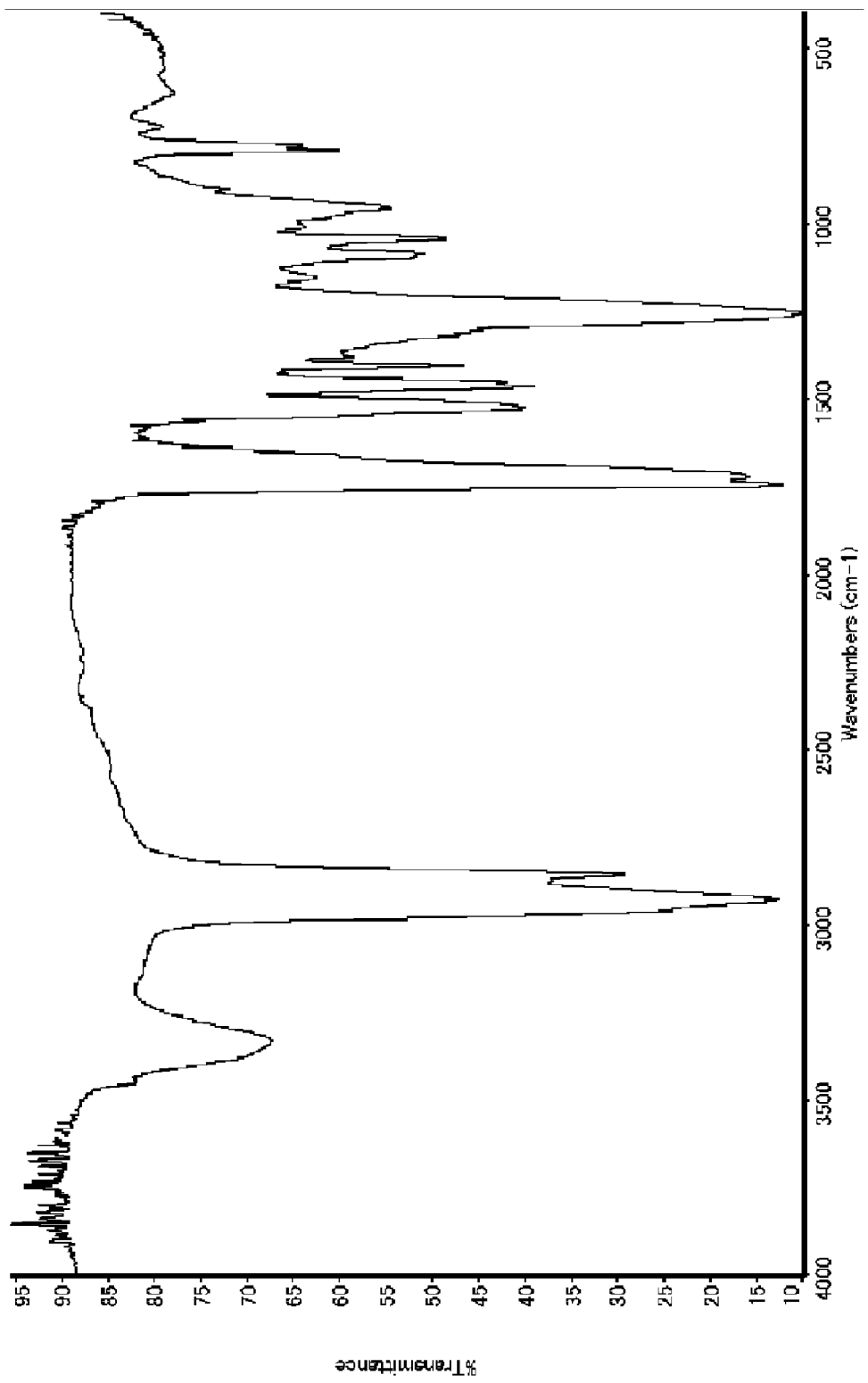
FIG. 14 is an IR spectrum of the carboxyl group-containing polyurethane BU3 in Examples.

FIGS. 13 and 14 show a $^1$H-NMR spectrum (solvent: CDCl$_3$) and an IR spectrum, respectively, of the carboxyl group-containing polyurethane BU3.

Example 8

A reactor equipped with a stirrer, a thermometer and a condenser was charged with 274.6 g of the product A5 from Example 4, 35.7 g of 2,2-dimethylolbutanoic acid (manufactured by Nippon Kasei Chemical Co., Ltd.) as a carboxyl group-containing diol, and 330.0 g and 220.0 g of γ-butyrolactone (manufactured by Mitsubishi Chemical Corporation) and diethylene glycol diethyl ether (manufactured by Nippon Nyukazai Co., Ltd.), respectively, as solvents. The materials were heated to 100° C. and were completely dissolved. The temperature of the reaction liquid was lowered to 90° C., and 135.7 g of methylenebis(4-cyclohexylisocyanate) (product name: DESMODUR W, manufactured by Sumika Bayer Urethane Co., Ltd.) as a polyisocyanate was added dropwise with a dropping funnel over a period of 30 minutes. Thereafter, a reaction was performed at 120° C. for 6 hours. When the substantial disappearance of the isocyanate was confirmed, 4.0 g of isobutanol (manufactured by Wako Pure Chemical Industries, Ltd.) was added dropwise and a reaction was performed at 120° C. for 3 hours. Thus, a carboxyl group-containing polyurethane solution (hereinafter, the carboxyl group-containing polyurethane solution B4) was obtained.

The carboxyl group-containing polyurethane solution B4 had a viscosity of 12000 mPa·s. The carboxyl group-containing polyurethane contained in the carboxyl group-containing polyurethane solution B4 (hereinafter, the carboxyl group-containing polyurethane BU4) had a number average molecular weight of 14000. The acid value of the carboxyl group-containing polyurethane BU4 was 30.0 mg KOH/g.

The carboxyl group-containing polyurethane solution B4 had a solid concentration of 45.0% by mass.

Figure 15:
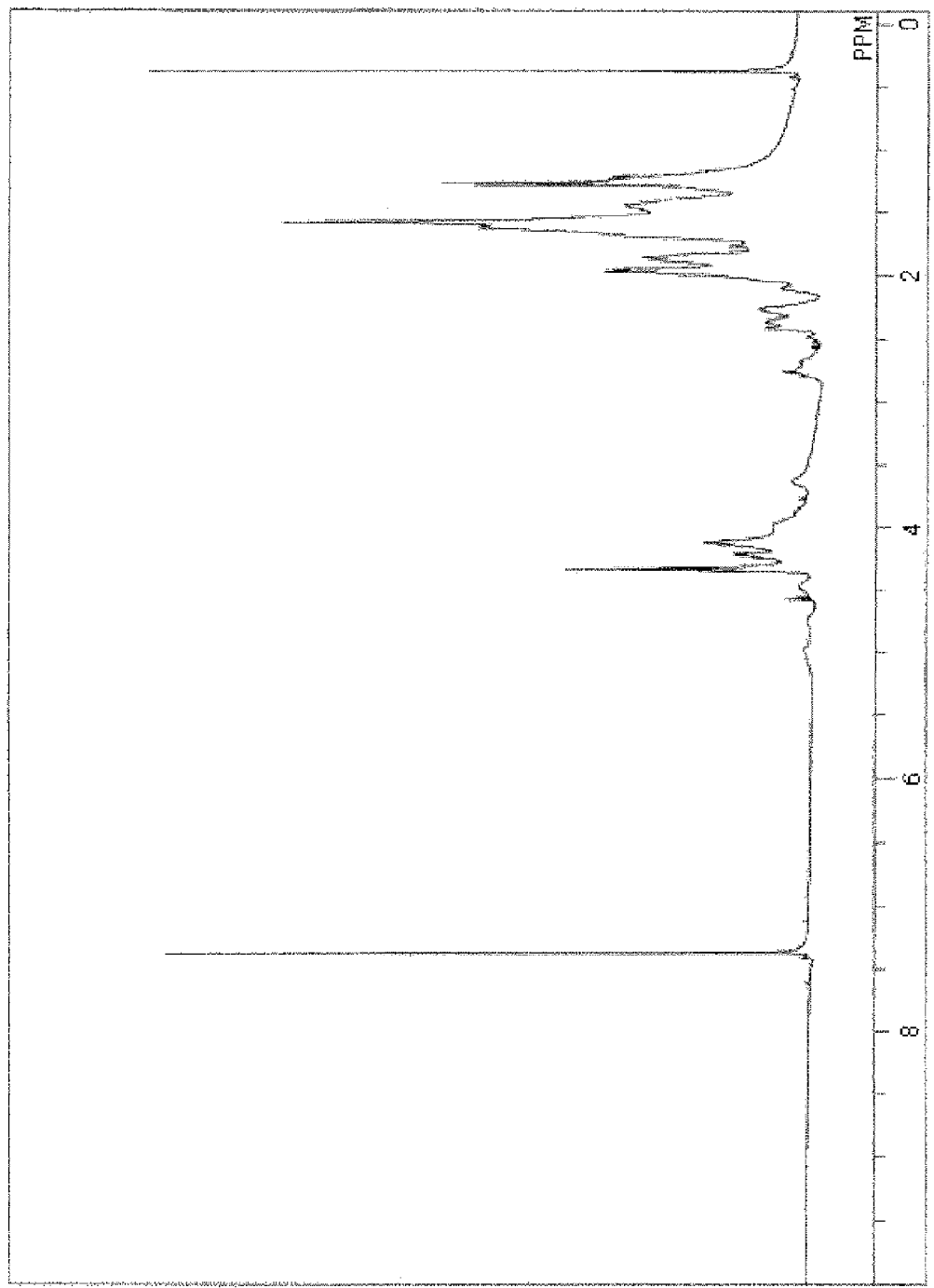
FIG. 15 is a $^1$H-NMR spectrum (solvent: $CDCl_3$) of a carboxyl group-containing polyurethane BU4 in Examples.
Figure 16:
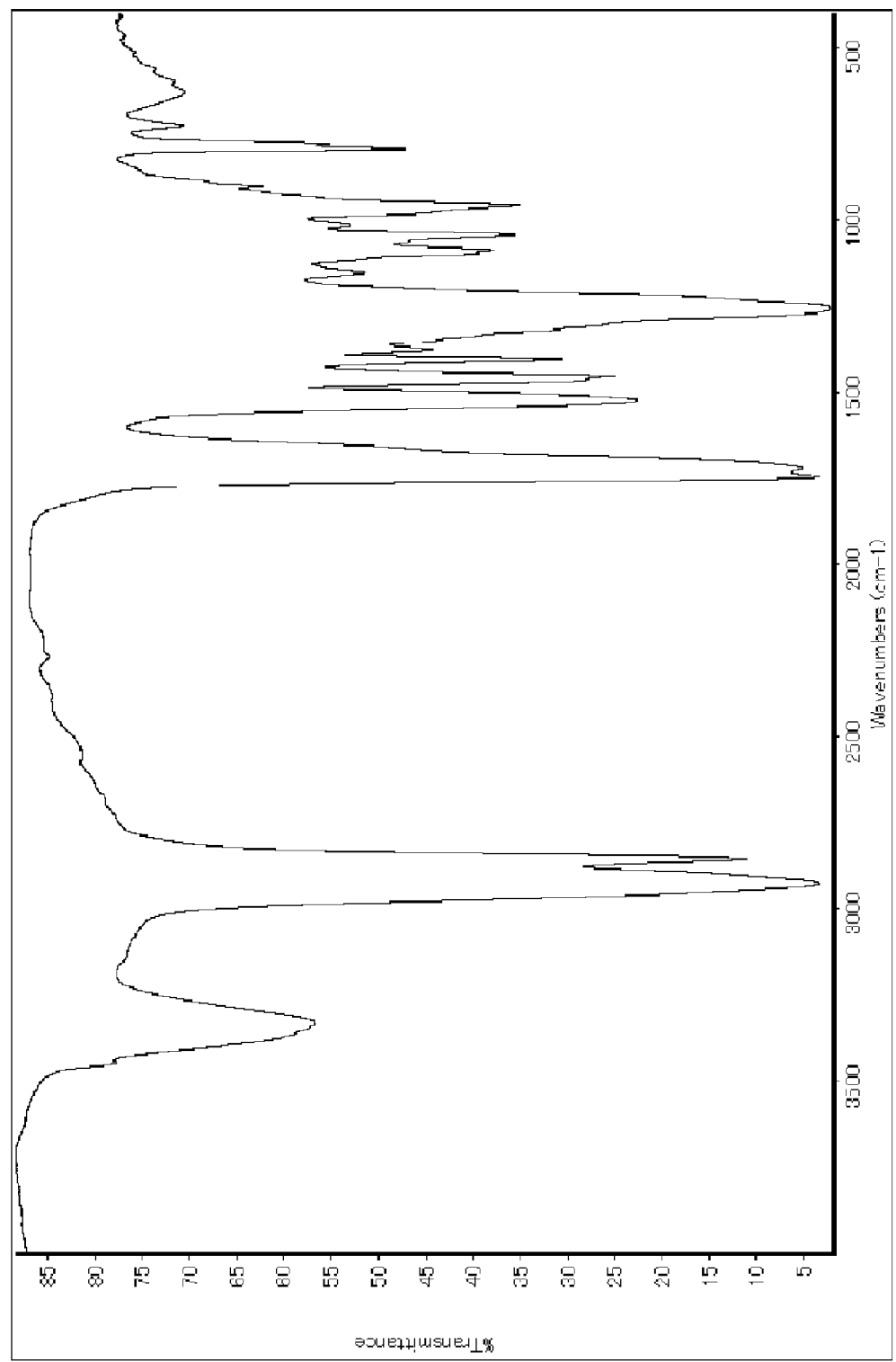
FIG. 16 is an IR spectrum of the carboxyl group-containing polyurethane BU4 in Examples.

FIGS. 15 and 16 show a $^1$H-NMR spectrum (solvent: CDCl$_3$) and an IR spectrum, respectively, of the carboxyl group-containing polyurethane BU4.

Comparative Example 1

A reactor equipped with a stirrer, a thermometer and a condenser was charged with 70.7 g of C-1065N (manufactured by KURARAY CO., LTD., a mixture of (poly)carbonate diol and raw material diols (1,9-nonanediol and 2-methyl-1,8-octanediol), molar ratio of raw material diols fed: 1,9-nonanediol:2-methyl-1,8-octanediol=65:35, hydroxyl value: 113.2 mg KOH/g, residual concentration of 1,9-nonanediol: 7.5% by mass, residual concentration of 2-methyl-1,8-octanediol: 4.4% by mass), 13.5 g of 2,2-dimethylolbutanoic acid (manufactured by Nippon Kasei Chemical Co., Ltd.) as a carboxyl group-containing diol, and 128.9 g of diethylene glycol monoethyl ether acetate (manufactured by DAICEL CHEMICAL INDUSTRIES, LTD.). The materials were completely dissolved by heating at 90° C. The temperature of the reaction liquid was lowered to 70° C. Subsequently, 42.4 g of methylenebis (4-cyclohexyl isocyanate) (product name: DESMODUR W, manufactured by Sumika Bayer Urethane Co., Ltd.) as a polyisocyanate was added dropwise to the liquid with use of a dropping funnel over a period of 30 minutes. After the completion of the dropwise addition, a reaction was performed at 80° C. for 1 hour, at 90° C. for 1 hour and at 100° C. for 2 hours, and the substantial disappearance of the isocyanate was confirmed. Thereafter, 1.46 g of isobutanol (manufactured by Wako Pure Chemical Industries, Ltd.) was added dropwise and a reaction was performed at 105° C. for 1.5 hours. Thus, a carboxyl group-containing polyurethane solution (hereinafter, the carboxyl group-containing polyurethane solution C1) was obtained.

The carboxyl group-containing polyurethane contained in the carboxyl group-containing polyurethane solution C1 (hereinafter, the carboxyl group-containing polyurethane CU1) had a number average molecular weight of 6800. The acid value of the carboxyl group-containing polyurethane CU1 was 39.9 mg KOH/g.

The carboxyl group-containing polyurethane solution C1 had a solid concentration of 49.5% by mass.

Comparative Example 2

A reactor equipped with a stirrer, a thermometer and a condenser was charged with 660.6 g of C-1015N (manufactured by KURARAY CO., LTD., a mixture of (poly)carbonate diol and raw material diols (1,9-nonanediol and 2-methyl-1,8-octanediol), molar ratio of raw material diols fed: 1,9-nonanediol:2-methyl-1,8-octanediol=15:85, hydroxyl value: 116.4 mg KOH/g, residual concentration of 1,9-nonanediol: 2.1% by mass, residual concentration of 2-methyl-1,8-octanediol: 9.3% by mass), 73.39 g of G-1000 (manufactured by NIPPON SODA CO., LTD., 1,2-polybutadiene terminated with a hydroxyl group at both terminals, number average molecular weight: 1548), 138.4 g of 2,2-dimethylolbutanoic acid (manufactured by Nippon Kasei Chemical Co., Ltd.) as a carboxyl group-containing diol, and 1303 g of diethylene glycol monoethyl ether acetate (manufactured by DAICEL CHEMICAL INDUSTRIES, LTD.). The 2,2-dimethylolbutanoic acid was dissolved at 90° C.

The temperature of the reaction liquid was lowered to 70° C. Subsequently, 437.3 g of methylenebis(4-cyclohexyl isocyanate) (product name: DESMODUR W, manufactured by Sumika Bayer Urethane Co., Ltd.) as a polyisocyanate was added dropwise to the liquid with use of a dropping funnel over a period of 30 minutes. After the completion of the dropwise addition, a reaction was performed at 80° C. for 1 hour, at 100° C. for 1 hour and at 120° C. for 2 hours, and the substantial disappearance of the isocyanate was confirmed by IR. Thereafter, 5 g of isobutanol (manufactured by Wako Pure Chemical Industries, Ltd.) was added dropwise and a reaction was performed at 120° C. for 1.5 hours. Thus, a carboxyl group-containing polyurethane solution (hereinafter, the carboxyl group-containing polyurethane solution C2) was obtained.

The carboxyl group-containing polyurethane contained in the carboxyl group-containing polyurethane solution C2 (hereinafter, the carboxyl group-containing polyurethane CU2) had a number average molecular weight of 13800. The acid value of the carboxyl group-containing polyurethane CU2 was 40.2 mg KOH/g.

The carboxyl group-containing polyurethane solution C2 had a solid concentration of 50.1% by mass.

<Production of Blends Including Carboxyl Group-Containing Polyurethane>

Blend Example 1

There were mixed 111.1 g of the carboxyl group-containing polyurethane solution B1, 5.0 g of silica powder (product name: AEROSIL R-974, manufactured by NIPPON AEROSIL CO., LTD.), 0.36 g of melamine (manufactured by NISSAN CHEMICAL INDUSTRIES, LTD.) as a curing accelerator, and 0.70 g of an antifoaming agent (product name: TSA750S, manufactured by Momentive Performance Materials Inc.). The mixture was further mixed with a three-roll mill (model: S-4SE x 11, manufactured by INOUE MANUFACTURING CO., LTD.), and thereby the silica powder, the curing accelerator and the antifoaming agent were mixed sufficiently with the carboxyl group-containing polyurethane solution B1. Thus, a main agent blend D1 was obtained.

Blend Examples 2-4 and Comparative Blend Examples 1-2

Blends were prepared according to the formulations shown in TABLE 1 in the same manner as described in Blend Example 1. The blends obtained in Blend Examples 2 to 4 are main agent blends D2 to D4, respectively. The blends obtained in Comparative Blend Examples 1 and 2 are main agent blends E1 and E2, respectively.

In TABLE 1, the formulations of the components in Blend Examples 1 to 4 and Comparative Blend Examples 1 and 2 are given in terms of grams.

TABLE 1

| | Blend Example 1 (main agent blend D1) | Blend Example 2 (main agent blend D2) | Blend Example 3 (main agent blend D3) | Blend Example 4 (main agent blend D4) | Comparative Blend Example 1 (main agent blend E1) | Comparative Blend Example 2 (main agent blend E2) |
|---|---|---|---|---|---|---|
| Carboxyl group-containing solution B1 (solid concentration: 45.0% by mass) | 111.1 | | | | | |
| Carboxyl group-containing solution B2 (solid concentration: 45.0% by mass) | | 111.1 | | | | |
| Carboxyl group-containing solution B3 (solid concentration: 45.0% by mass) | | | 111.1 | | | |
| Carboxyl group-containing solution B4 (solid concentration: 45.0% by mass) | | | | 111.1 | | |
| Carboxyl group-containing solution C1 (solid concentration: 49.5% by mass) | | | | | 101.0 | |

TABLE 1-continued

| | Blend Example 1 (main agent blend D1) | Blend Example 2 (main agent blend D2) | Blend Example 3 (main agent blend D3) | Blend Example 4 (main agent blend D4) | Comparative Blend Example 1 (main agent blend E1) | Comparative Blend Example 2 (main agent blend E2) |
|---|---|---|---|---|---|---|
| Carboxyl group-containing solution C2 (solid concentration: 50.1% by mass) | | | | | | 99.79 |
| Silica powder AEROSIL R-974 | 5.00 | 5.00 | 5.00 | 5.00 | 5.00 | 5.00 |
| Curing accelerator Melamine | 0.36 | 0.36 | 0.36 | 0.36 | 0.36 | 0.36 |
| Antifoaming agent TSA750S | 0.70 | 0.70 | 0.70 | 0.70 | 0.70 | 0.70 |
| Diethylene glycol monoethyl ether acetate | | | | | 10.1 | 11.31 |

<Preparation of Solutions Containing Curing Agent>

A container equipped with a stirrer, a thermometer and a condenser was charged with 300 g of an epoxy resin having the structure of Formula (4) below (grade: HP-7200H, manufactured by DIC, epoxy equivalent: 278 g/eq), 180 g of γ-butyrolactone (manufactured by Mitsubishi Chemical Corporation), and 120 g of diethylene glycol diethyl ether (manufactured by TOHO Chemical Industry Co., LTD.), followed by the initiation of stirring. While continuously stirring the materials, the temperature in the container was raised to 70° C. using an oil bath. The stirring was terminated after 30 minutes after the inside temperature reached 70° C. The epoxy resin HP-7200H was confirmed to have been dissolved completely, and the solution was cooled to room temperature. Thus, a HP-7200H solution with a concentration of 50% by mass was obtained. The solution will be referred to as the curing agent solution F1.

A container equipped with a stirrer and a condenser was charged with 300 g of an epoxy resin having the structure of Formula (5) below (grade: jER604, manufactured by Japan Epoxy Resins Co., Ltd., epoxy equivalent: 120 g/eq), 180 g of γ-butyrolactone (manufactured by Mitsubishi Chemical Corporation), and 120 g of diethylene glycol diethyl ether (manufactured by TOHO Chemical Industry Co., LTD.), followed by the initiation of stirring. After stirring for 1 hour, the epoxy resin jER604 was confirmed to have been dissolved completely. Thus, a jER604 solution with a concentration of 50% by mass was obtained. The solution will be referred to as the curing agent solution F2.

The solutions F1 and F2 were mixed in a (mass) ratio of 1:1 to give a curing agent solution F3.

[Chem. 42]

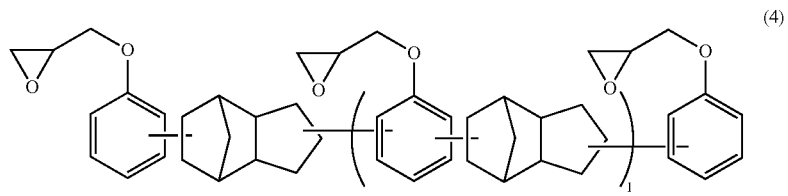

(4)

wherein l is an integer.

[Chem. 43]

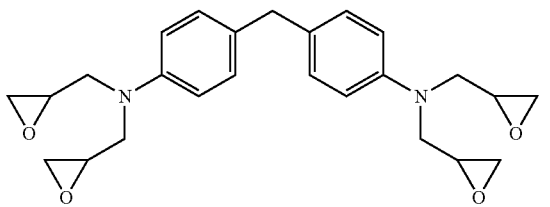

(5)

<Production of Curable Compositions>

Example 9

The main agent blend D1 weighing 200.0 g was mixed together with 25.4 g of the curing agent solution F1. The mixture was stirred sufficiently with a spatula. Thereafter, the viscosity was adjusted by adding a solvent mixture of γ-butyrolactone:diethylene glycol diethyl ether=3:2 (mass ratio) in an amount required to obtain a thixotropic index of 1.3. Thus, a curable composition (hereinafter, the curable composition G1) was obtained.

Example 10

The components were mixed in the formulation given in TABLE 2, and the mixture was stirred sufficiently with a spatula. Thereafter, the viscosity was adjusted by adding a solvent mixture of γ-butyrolactone:diethylene glycol diethyl ether=3:2 (mass ratio) in an amount required to obtain a thixotropic index of 1.3. Thus, a curable composition (hereinafter, the curable composition G2) was obtained.

Example 11

The components were mixed in the formulation given in TABLE 2, and the mixture was stirred sufficiently with a spatula. Thereafter, the viscosity was adjusted by adding a solvent mixture of γ-butyrolactone:diethylene glycol diethyl ether=3:2 (mass ratio) in an amount required to obtain a thixotropic index of 1.3. Thus, a curable composition (hereinafter, the curable composition G3) was obtained.

Example 12

The components were mixed in the formulation given in TABLE 2, and the mixture was stirred sufficiently with a spatula. Thereafter, the viscosity was adjusted by adding a solvent mixture of γ-butyrolactone:diethylene glycol diethyl ether=3:2 (mass ratio) in an amount required to obtain a thixotropic index of 1.3. Thus, a curable composition (hereinafter, the curable composition G4) was obtained.

Example 13

The components were mixed in the formulation given in TABLE 2, and the mixture was stirred sufficiently with a spatula. Thereafter, the viscosity was adjusted by adding a solvent mixture of γ-butyrolactone:diethylene glycol diethyl ether=3:2 (mass ratio) in an amount required to obtain a thixotropic index of 1.3. Thus, a curable composition (hereinafter, the curable composition G5) was obtained.

Example 14

The components were mixed in the formulation given in TABLE 2, and the mixture was stirred sufficiently with a spatula. Thereafter, the viscosity was adjusted by adding a solvent mixture of γ-butyrolactone:diethylene glycol diethyl ether=3:2 (mass ratio) in an amount required to obtain a thixotropic index of 1.3. Thus, a curable composition (hereinafter, the curable composition G6) was obtained.

Example 15

The components were mixed in the formulation given in TABLE 2, and the mixture was stirred sufficiently with a spatula. Thereafter, the viscosity was adjusted by adding a solvent mixture of γ-butyrolactone:diethylene glycol diethyl ether=3:2 (mass ratio) in an amount required to obtain a thixotropic index of 1.3. Thus, a curable composition (hereinafter, the curable composition G7) was obtained.

Example 16

The components were mixed in the formulation given in TABLE 2, and the mixture was stirred sufficiently with a spatula. Thereafter, the viscosity was adjusted by adding a solvent mixture of γ-butyrolactone:diethylene glycol diethyl ether=3:2 (mass ratio) in an amount required to obtain a thixotropic index of 1.3. Thus, a curable composition (hereinafter, the curable composition G8) was obtained.

Example 17

The components were mixed in the formulation given in TABLE 2, and the mixture was stirred sufficiently with a spatula. Thereafter, the viscosity was adjusted by adding a solvent mixture of γ-butyrolactone:diethylene glycol diethyl ether=3:2 (mass ratio) in an amount required to obtain a thixotropic index of 1.3. Thus, a curable composition (hereinafter, the curable composition G9) was obtained.

Comparative Example 3

The components were mixed in the formulation given in TABLE 2, and the mixture was stirred sufficiently with a spatula. Thereafter, the viscosity was adjusted by adding diethylene glycol monoethyl ether acetate in an amount required to obtain a thixotropic index of 1.3. Thus, a curable composition (hereinafter, the curable composition H1) was obtained.

Comparative Example 4

The components were mixed in the formulation given in TABLE 2, and the mixture was stirred sufficiently with a spatula. Thereafter, the viscosity was adjusted by adding diethylene glycol monoethyl ether acetate in an amount required to obtain a thixotropic index of 1.3. Thus, a curable composition (hereinafter, the curable composition H2) was obtained.

TABLE 2

| | Curable composition G1 | Curable composition G2 | Curable composition G3 | Curable composition G4 | Curable composition G5 | Curable composition G6 | Curable composition G7 | Curable composition G8 | Curable composition G9 | Curable composition H1 | Curable composition H2 |
|---|---|---|---|---|---|---|---|---|---|---|---|
| Main agent blend D1 | 200.0 | | | | 200.0 | | | | | | |
| Main agent blend D2 | | 200.0 | | | | 200.0 | | | | | |
| Main agent blend D3 | | | 200.0 | | | | 200.0 | | | | |
| Main agent blend D4 | | | | 200.0 | | | | 200.0 | 200.0 | | |
| Main agent blend E1 | | | | | | | | | | 200.0 | |
| Main agent blend E2 | | | | | | | | | | | 200.0 |
| Curing agent solution F1 (solid concn. 50% by mass) | 25.4 | 25.4 | 25.4 | 25.4 | | | | | | | |

TABLE 2-continued

| | Curable composition G1 | Curable composition G2 | Curable composition G3 | Curable composition G4 | Curable composition G5 | Curable composition G6 | Curable composition G7 | Curable composition G8 | Curable composition G9 | Curable composition H1 | Curable composition H2 |
|---|---|---|---|---|---|---|---|---|---|---|---|
| Curing agent solution F2 (solid concn. 50% by mass) | | | | | 11.0 | 11.0 | 11.0 | 11.0 | | 14.5 | 14.6 |
| Curing agent solution F3 (solid concn. 50% by mass) | | | | | | | | | 15.3 | | |
| Solvent | solvent mixture of γ-butyrolactone:diethylene glycol diethyl ether = 3:2 (by mass) | | | | | | | | | diethylene glycol monoethyl ether acetate | |

Examples 18 to 26 and Comparative Examples 5 and 6

The curable compositions G1 to G9, H1 and H2 were tested by the following methods to evaluate the adhesion with polyimide and tin-plated copper, the warpage and the long-term electrical insulation reliability as described in TABLE 3. The results are set forth in TABLE 3.

Evaluation of Adhesion with Polyimide and Tin-Plated Copper

A substrate was provided which was a flexible copper-clad laminate (grade: S'PERFLEX, manufactured by SUMITOMO METAL MINING CO., LTD., copper thickness: 8 μm, polyimide thickness: 38 μm) plated with tin. Further, a polyimide film (Kapton (registered trademark) 300 H, manufactured by DU PONT-TORAY CO., LTD.) was provided. The curable composition G1 was screen printed on each of the substrate and the polyimide film such that the thickness (dry thickness) of the curable composition would be 15 μm. The composition was dried in a hot air circulation dryer at 80° C. for 30 minutes and was cured in a hot air circulation dryer at 120° C. for 120 minutes. The cured films were cut to draw 100 squares in a grid pattern with pitches of 1 mm. A peel tape (in accordance with JIS Z 1522) cut to a length of approximately 75 mm was applied to the grid pattern and was peeled at nearly 60° in 0.5 to 1.0 second.

The peel tape was a product from NITTO DENKO CORPORATION. The evaluation was made based on the following criteria.

AA: 80 or more squares remained.
BB: 50 to less than 80 squares remained.
CC: Less than 50 squares remained.

The results are set forth in TABLE 3.

The curable compositions G2 to G9, H1 and H2 were evaluated in the same manner.

The results are set forth in TABLE 3.

Evaluation of Warpage

The curable composition G1 was screen printed on a substrate. The composition was dried in a hot air circulation dryer at 80° C. for 30 minutes and was cured in a hot air circulation dryer at 120° C. for 60 minutes. The substrate used was a 38 μm thick polyimide film (Kapton (registered trademark) 150EN, manufactured by DU PONT-TORAY CO., LTD.).

The multilayer film formed by applying the curable composition and curing it in the dryer was cut with a circle cutter to a diameter of 50 mm. The circular piece was convex or concave in the vicinity of the center. The test piece was allowed to stand at temperatures of 23±0.5° C. and humidities of 60±5% RH for at least 12 hours. The test piece was then placed with the outwardly curved side down. The height of the largest warpage from the plane level, and the height of the point that was symmetrical thereto about the center of the circle were measured with a meter. These heights from the plane level were averaged. The negative and positive symbols represent the direction of the warpage. The positive sign indicates that the cured film was upside and the polyimide film was downside when the test piece was placed with the outwardly curved side down. The negative sign indicates that the cured film was downside.

The results are set forth in TABLE 3.

The curable compositions G2 to G9, H1 and H2 were evaluated in the same manner.

The results are set forth in TABLE 3.

Evaluation of Flexibility

A flexible copper-clad laminate (grade: S'PERFLEX, manufactured by SUMITOMO METAL MINING CO., LTD., copper thickness: 8 μm, polyimide thickness: 38 μm) was provided. The curable composition G1 was screen printed on the copper of the laminate such that the width and the length were 75 mm and 110 mm, respectively, and the thickness of the obtainable cured film would be 15 μm. The composition was allowed to stand at room temperature for 10 minutes and was cured in a hot air circulation dryer at 120° C. for 60 minutes. The PET film that was the backing of the test piece was removed, and the test piece was cut to a 10 mm wide strip with the use of a cutter knife. The strip was bent approximately 180° with the cured film outside and was compressed with a compressor at 0.5±0.2 MPa for 3 seconds. The bent portion of the strip in the bent shape was observed with a microscope at ×30 magnification to examine the occurrence of cracks.

The results are set forth in TABLE 3.

The curable compositions G2 to G9, H1 and H2 were evaluated in the same manner.

The results are set forth in TABLE 3.

Evaluation of Long-Term Electrical Insulation Reliability

A flexible copper-clad laminate (grade: S'PERFLEX, manufactured by SUMITOMO METAL MINING CO., LTD., copper thickness: 8 μm, polyimide thickness: 38 μm) was etched to give a substrate with a fine comb pattern as described in JPCA-ET01 (copper wire width/copper wire interval=15 μm/15 μm). The substrate was plated with tin to afford a flexible circuit board. The curable composition G1 was screen printed on the board such that the thickness (after drying) from the polyimide surface would be 15 μm. The composition was held in a hot air circulation dryer at 80° C. for 30 minutes and was cured in a hot air circulation dryer at 120° C. for 120 minutes.

A bias voltage of 60 V was applied to the thus-prepared test piece, and a constant temperature and humidity test was performed at 120° C. and 95% RH using MIGRATION TESTER MODEL MIG-8600 (manufactured by IMV). TABLE 3 shows the resistivity at an early stage after the initiation of the constant temperature and humidity test, and after 30 hours, 50 hours and 100 hours after the initiation of the test.

The curable compositions G2 to G9, H1 and H2 were evaluated in the same manner.

The results are set forth in TABLE 3.

TABLE 3

|  |  | Unit | Ex. 18 | Ex. 19 | Ex. 20 | Ex. 21 | Ex. 22 | Ex. 23 | Ex. 24 | Ex. 25 | Ex. 26 | Comp. Ex. 5 | Comp. Ex. 6 |
|---|---|---|---|---|---|---|---|---|---|---|---|---|---|
| Curable composition used |  |  | Curable composition G1 | Curable composition G2 | Curable composition G3 | Curable composition G4 | Curable composition G5 | Curable composition G6 | Curable composition G7 | Curable composition G8 | Curable composition G9 | Curable composition H1 | Curable composition H2 |
| Warpage |  | mm | −1.5 | 0.0 | −1.0 | −1.0 | −1.5 | 0.0 | −1.0 | −1.0 | −1.0 | −2.0 | −1.5 |
| Adhesion | With polyimide |  | AA | AA | AA | AA | AA | AA | AA | AA | AA | AA | AA |
|  | With tin-plated copper |  | AA | AA | AA | AA | AA | AA | AA | AA | AA | AA | AA |
| Flexibility | Cracks |  | none | none | none | none | none | none | none | none | none | none | none |
| Long-term electrical insulation reliability | Early stage | Ω | $1 \times 10^9$ | $2 \times 10^9$ | $1 \times 10^9$ | $1 \times 10^9$ | $9 \times 10^8$ | $1 \times 10^9$ | $9 \times 10^8$ | $9 \times 10^8$ | $9 \times 10^8$ | $8 \times 10^7$ | $1 \times 10^8$ |
|  | After 30 hours |  | $3 \times 10^9$ | $5 \times 10^9$ | $3 \times 10^9$ | $3 \times 10^9$ | $1 \times 10^9$ | $2 \times 10^9$ | $1 \times 10^9$ | $1 \times 10^9$ | $1 \times 10^9$ | $1 \times 10^8$ | $2 \times 10^8$ |
|  | After 50 hours |  | $3 \times 10^9$ | $5 \times 10^9$ | $3 \times 10^9$ | $3 \times 10^9$ | $2 \times 10^9$ | $3 \times 10^9$ | $2 \times 10^9$ | $2 \times 10^9$ | $2 \times 10^9$ | $1 \times 10^8$ | $2 \times 10^8$ |
|  | After 100 hours |  | $2 \times 10^9$ | $5 \times 10^9$ | $2 \times 10^9$ | $2 \times 10^9$ | $1 \times 10^9$ | $2 \times 10^9$ | $1 \times 10^9$ | $1 \times 10^9$ | $1 \times 10^9$ | $9 \times 10^7$ | $1 \times 10^8$ |

The results in TABLE 3 show that the curable compositions according to the aspect (V) of the invention which contained the carboxyl group-containing polyurethane in the aspect (II) prepared using (poly)carbonate diol of the aspect (I), as well as the solvent and the curing agent were capable of giving cured products having long-term electrical insulation properties at high level. The cured products of the invention are obtained by curing such compositions.

The invention claimed is:

1. A (poly)carbonate polyol which comprises an organic residue derived from a dimer diol and an organic residue derived from a polyol having a C10-20 alicyclic structure, and which is represented by Formula (34):

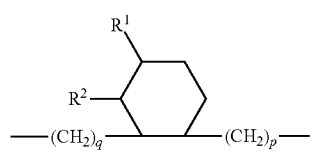

(34)

wherein each $R^6$ independently represents an alkylene group belonging to group (A), group (B) or group (C) below; t is an integer of 1 or greater; of the (t+1) $R^6$ groups, at least one $R^6$ is an alkylene group selected from group (A); and at least one $R^6$ is an alkylene group selected from group (B);

Group (A): alkylene groups represented by Formula (35) or (36) below;

Group (B): alkylene groups represented by Formula (37) or (38) below; and

Group (C): C9-12 linear aliphatic alkylene groups;

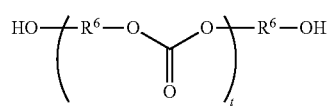

(35)

wherein $R^1$ and $R^2$ are each an alkyl group, and p and q have values such that the total number of the carbon atoms in $R^1$ and $R^2$, $-(CH_2)_p-$ and $-(CH_2)_q-$ is 30;

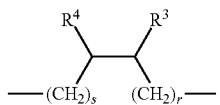

(36)

wherein $R^3$ and $R^4$ are each an alkyl group, and r and s have values such that the total number of the carbon atoms in $R^3$ and $R^4$, $-(CH_2)_r-$ and $-(CH_2)_s-$ is 34;

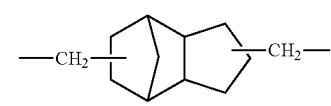

(37)

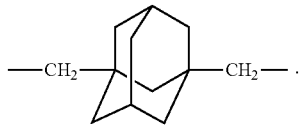

(38)

2. A carboxyl group-containing polyurethane obtainable from at least the following components (a), (b) and (c) as materials:
component (a): the (poly)carbonate polyol described in claim 1;
component (b): a polyisocyanate; and
component (c): a carboxyl group-containing polyol.

3. A carboxyl group-containing polyurethane obtainable from at least the following components (a), (b), (c) and (d) as materials:
component (a): the (poly)carbonate polyol described in claim 1;
component (b): a polyisocyanate;
component (c): a carboxyl group-containing polyol; and
component (d): a polyol other than the components (a) and (c).

4. The carboxyl group-containing polyurethane according to claim 2, wherein the materials further include a monohydroxy compound (component (e)).

5. The carboxyl group-containing polyurethane according to claim 2, wherein the materials further include a monoisocyanate compound (component (f)).

6. A carboxyl group-containing polyurethane solution which comprises the carboxyl group-containing polyurethane described in claim 2 and a solvent having a boiling point of 120 to 300° C.

7. A process for producing carboxyl group-containing polyurethanes which comprises reacting at least the following components (a), (b) and (c) at a temperature in the range of 30° C. to 160° C. in a solvent including at least one selected from the group consisting of diethylene glycol dimethyl ether, diethylene glycol diethyl ether, diethylene glycol ethyl methyl ether, diethylene glycol dibutyl ether, diethylene glycol butyl methyl ether, diethylene glycol isopropyl methyl ether, triethylene glycol dimethyl ether, triethylene glycol butyl methyl ether, tetraethylene glycol dimethyl ether, dipropylene glycol dimethyl ether, tripropylene glycol dimethyl ether, anisole, ethylene glycol monomethyl ether acetate, ethylene glycol monoethyl ether acetate, propylene glycol monomethyl ether acetate, propylene glycol monoethyl ether acetate, dipropylene glycol monomethyl ether acetate, dipropylene glycol monoethyl ether acetate, diethylene glycol monoethyl ether acetate, diethylene glycol monomethyl ether acetate, methyl methoxypropionate, ethyl methoxypropionate, methyl ethoxypropionate, ethyl ethoxypropionate, decahydronaphthalene, cyclohexanone and γ-butyrolactone;

component (a): the (poly)carbonate polyol described in claim 1;
component (b): a polyisocyanate; and
component (c): a carboxyl group-containing polyol.

8. A curable composition that comprises the carboxyl group-containing polyurethane described in claim 2, a solvent having a boiling point of 120 to 300° C., and a curing agent.

9. The curable composition according to claim 8, wherein the curing agent is a compound having two or more epoxy groups in the molecule.

10. A cured product obtainable by curing the curable resin composition described in claim 8.

11. A flexible circuit board covered with a cured product, in which a circuit is formed on a flexible substrate, wherein the surface of the flexible substrate having the circuit is partially or entirely covered with the cured product described in claim 10.

12. A process for manufacturing flexible circuit boards covered with a protective film, which comprises printing the curable composition described in claim 8 to an area including a tin-plated circuit pattern of a flexible circuit board to form a print film on the pattern, and heating and curing the print film at 80 to 130° C. to produce a protective film.

* * * * *